United States Patent [19]

Seki et al.

[11] Patent Number: 5,581,523
[45] Date of Patent: Dec. 3, 1996

[54] LASER EMISSION UNIT, OPTICAL HEAD AND OPTICAL MEMORY DEVICE

[75] Inventors: Hideya Seki; Masatoshi Yonekubo; Toshio Arimura; Takashi Takeda, all of Suwa, Japan

[73] Assignee: Seiko Epson Corporation, Tokyo, Japan

[21] Appl. No.: 153,711

[22] Filed: Nov. 16, 1993

[30] Foreign Application Priority Data

Nov. 17, 1992 [JP] Japan .................. 4-307322
Nov. 25, 1992 [JP] Japan .................. 4-315342
Feb. 8, 1993 [JP] Japan .................. 5-020354
Apr. 13, 1993 [JP] Japan .................. 5-086530
Apr. 20, 1993 [JP] Japan .................. 5-092893

[51] Int. Cl.⁶ .................. G11B 7/00; G11B 7/12
[52] U.S. Cl. .................. 369/44.11; 369/44.12; 369/44.15; 369/44.23; 369/44.37; 369/121; 369/112
[58] Field of Search .................. 369/112, 121, 369/44.11, 44.12, 44.15, 44.23, 44.37, 121

[56] References Cited

U.S. PATENT DOCUMENTS

| | | | |
|---|---|---|---|
| 5,157,649 | 10/1992 | Suzuki | 369/110 |
| 5,168,485 | 12/1992 | Lehureau et al. | 369/44.12 |
| 5,293,367 | 3/1994 | Kadowaki et al. | 369/44.37 |
| 5,360,970 | 11/1994 | Kay | 250/201.5 |
| 5,361,244 | 11/1994 | Nakamura et al. | 369/44.23 |
| 5,374,819 | 12/1994 | Kim et al. | 369/44.23 |

FOREIGN PATENT DOCUMENTS

| | | |
|---|---|---|
| 0199565 | 10/1986 | European Pat. Off. |
| 0478222 | 4/1992 | European Pat. Off. |
| 56-150889 | 11/1981 | Japan . |
| 61-003326 | 1/1986 | Japan . |
| 61-000941 | 1/1986 | Japan . |
| 61-280044 | 12/1986 | Japan . |
| 62-009545 | 1/1987 | Japan . |
| 63-074149 | 4/1988 | Japan . |
| 63-113948 | 5/1988 | Japan . |
| 2-172029 | 7/1990 | Japan . |
| 2253687 | 10/1990 | Japan . |
| 2265036 | 10/1990 | Japan . |
| 3-203044 | 9/1991 | Japan . |
| 4-056291 | 2/1992 | Japan . |
| 04311828 | 4/1992 | Japan . |
| 4-195936 | 7/1992 | Japan . |
| WO8706386 | 10/1987 | WIPO . |

OTHER PUBLICATIONS

IEEE GaAs IC Symposium, Technical Digest 1988, Nashville, Tennessee, Nov. 6–9, 1988, pp. 151–154, Kobayashi et al., "A High Frequency GaAs Multivibrator IC".

Primary Examiner—Viet Q. Nguyen
Attorney, Agent, or Firm—Harold T. Tsiang

[57] ABSTRACT

A laser emission unit for use in an optical head performs a plurality of functions which are integrated. A laser beam from the laser emission unit mounted in a lens holder is emitted through an objective lens and is focused on an optical medium. A reflected beam from the optical medium returns through the objective lens and a diffraction grating to a signal detection circuit in the laser emission unit. Since the laser emission unit performs a plurality of functions, the space for various elements otherwise required in the optical head can be eliminated. The space for an additional light path for the reflected beam is also eliminated. Therefore, the size of the optical head is very small. Since the optical head can be assembled by using a small number of parts, the production costs can be reduced. Furthermore, the optical head can shield the noises by using the housing and/or the lens holder itself.

11 Claims, 23 Drawing Sheets

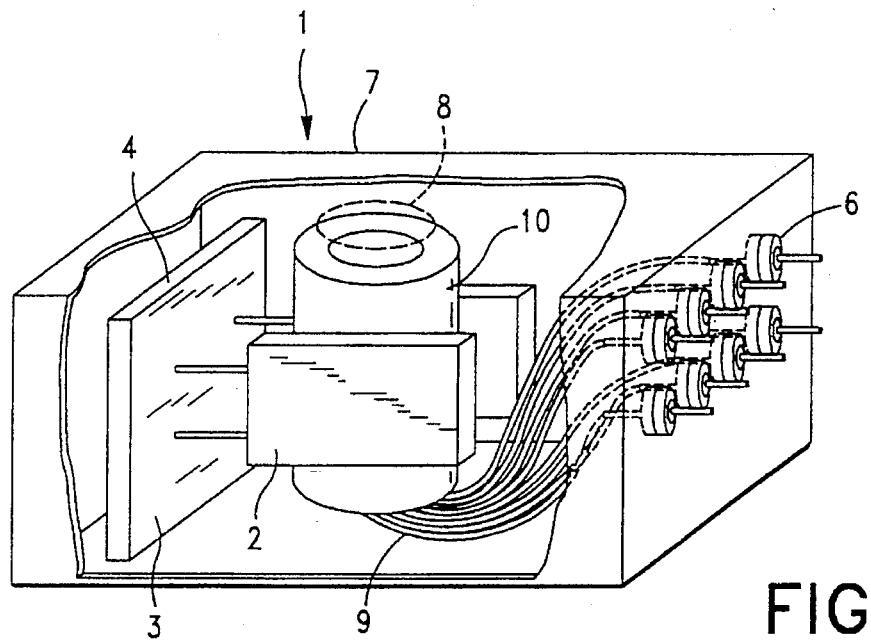
FIG.—1
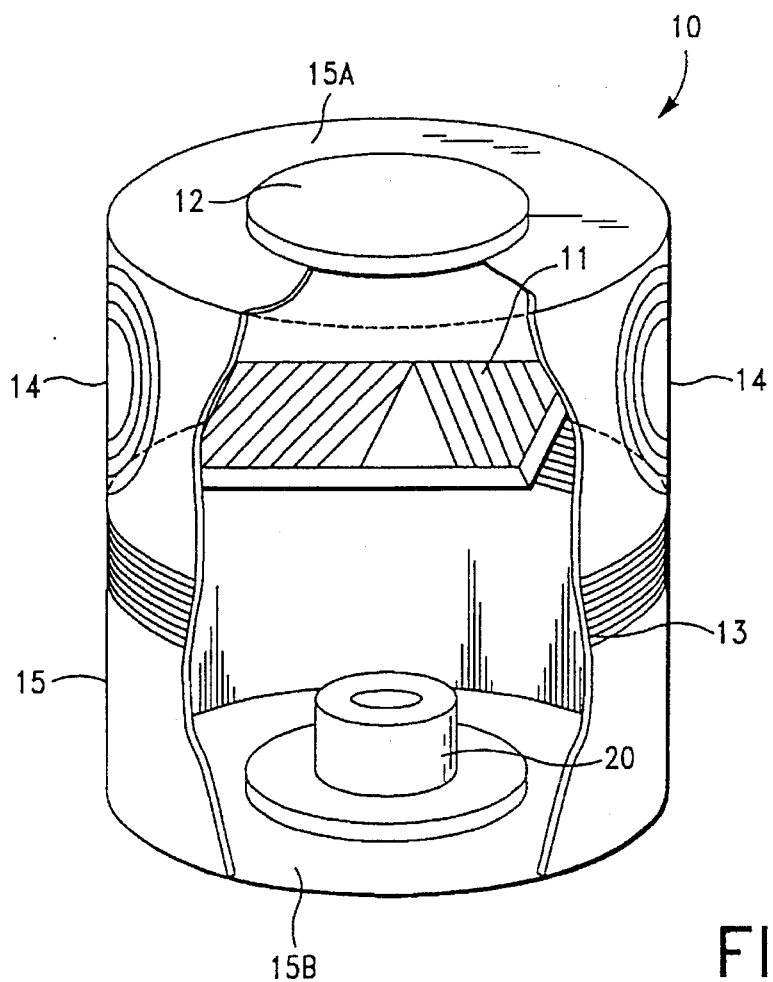
FIG.—2

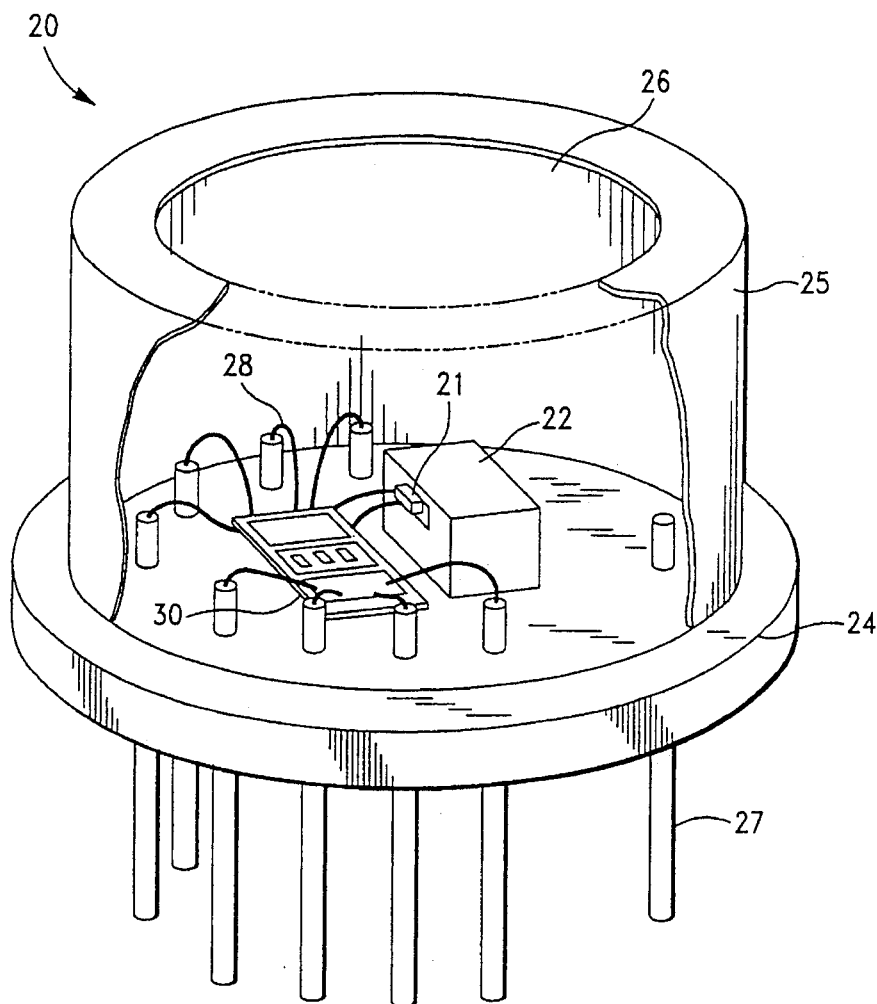
FIG.—3
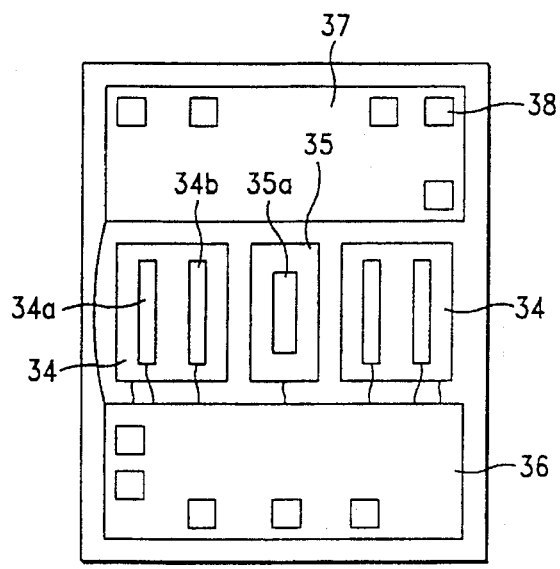
FIG.—4

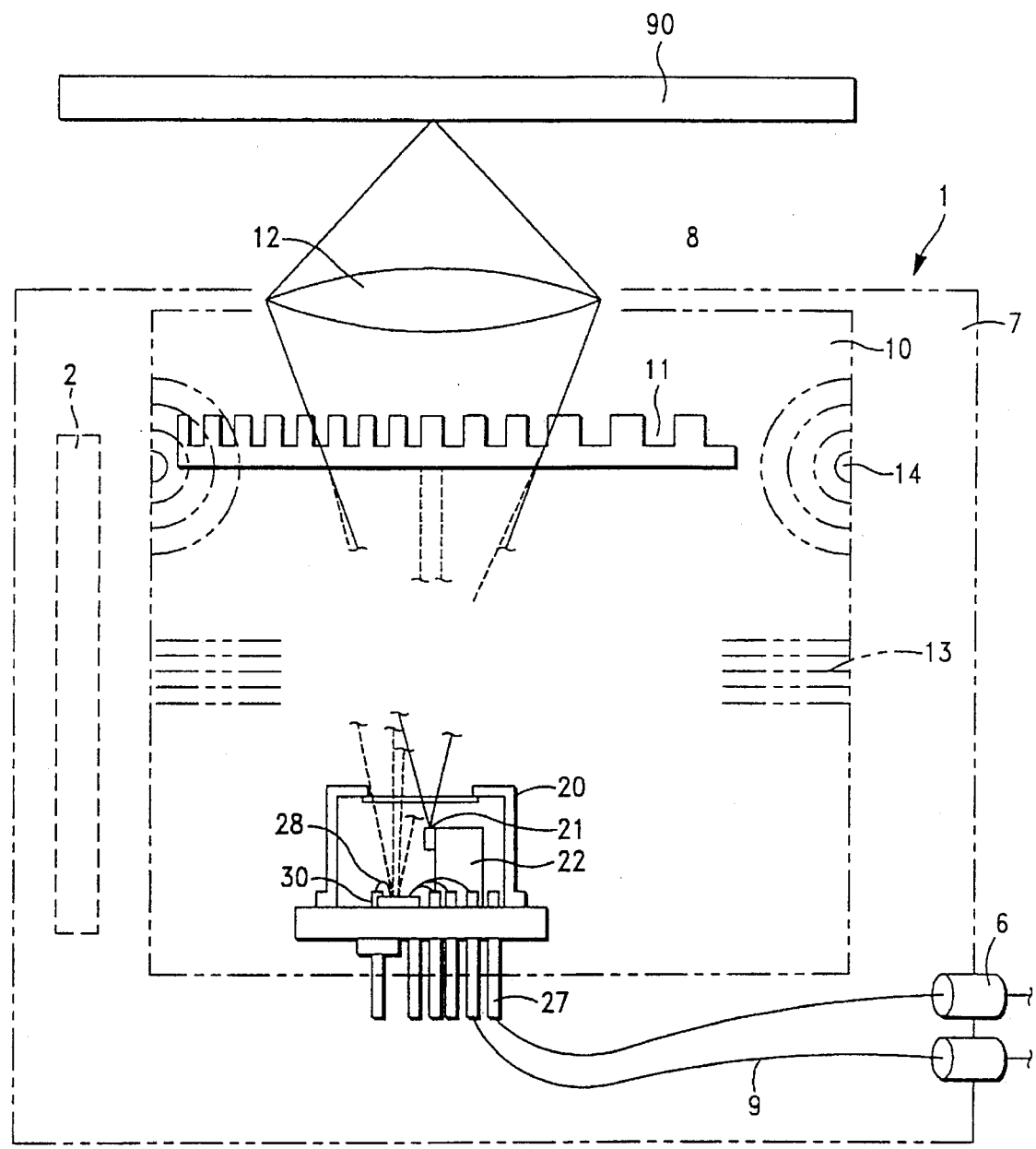
FIG.—5

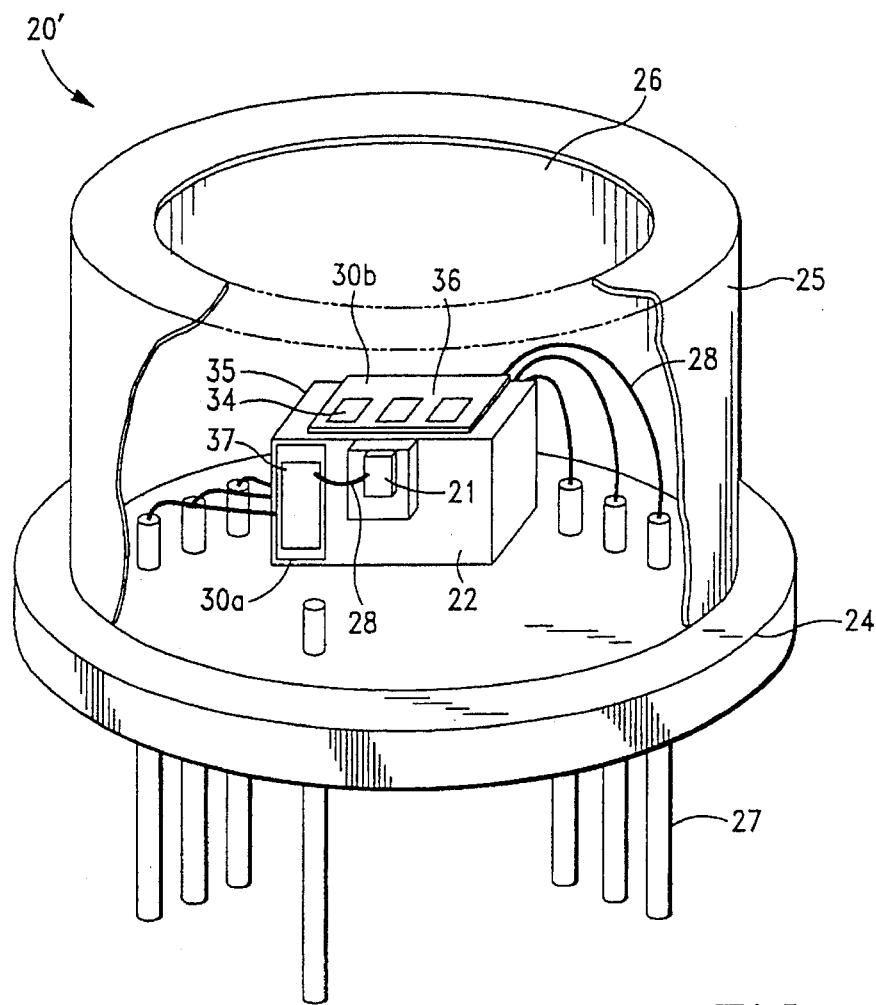
FIG.—10
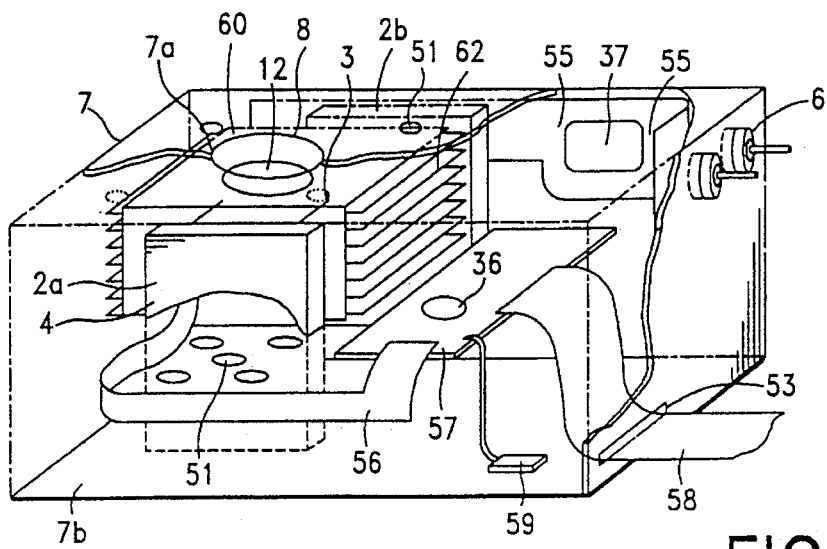
FIG.—11

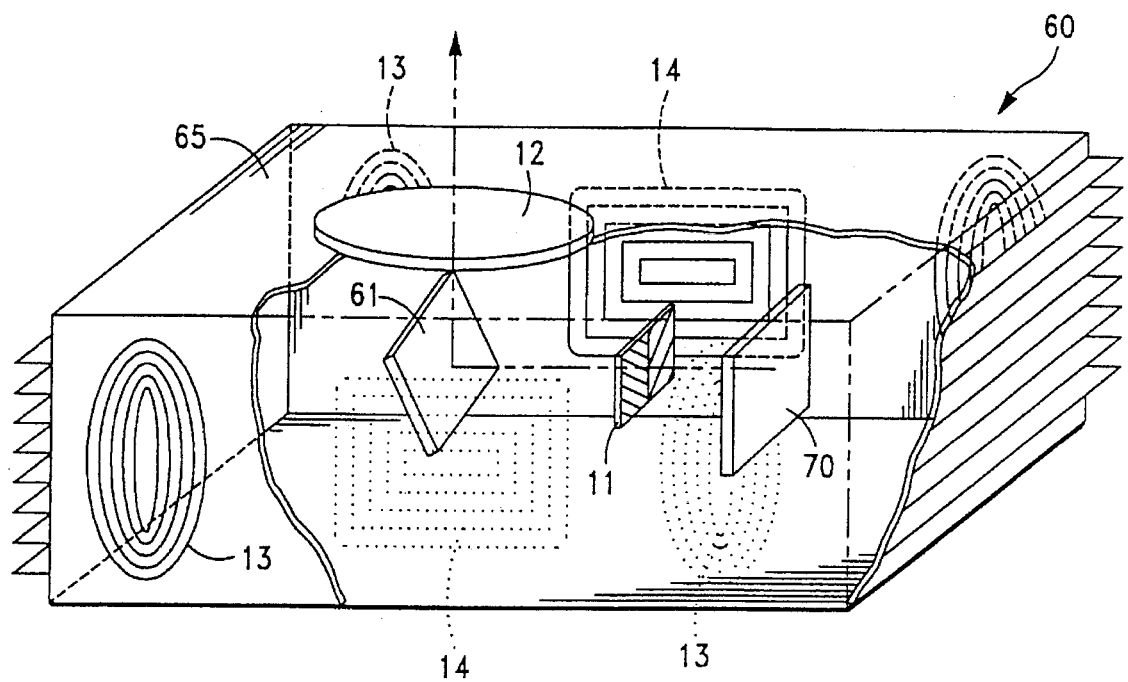
FIG.—12
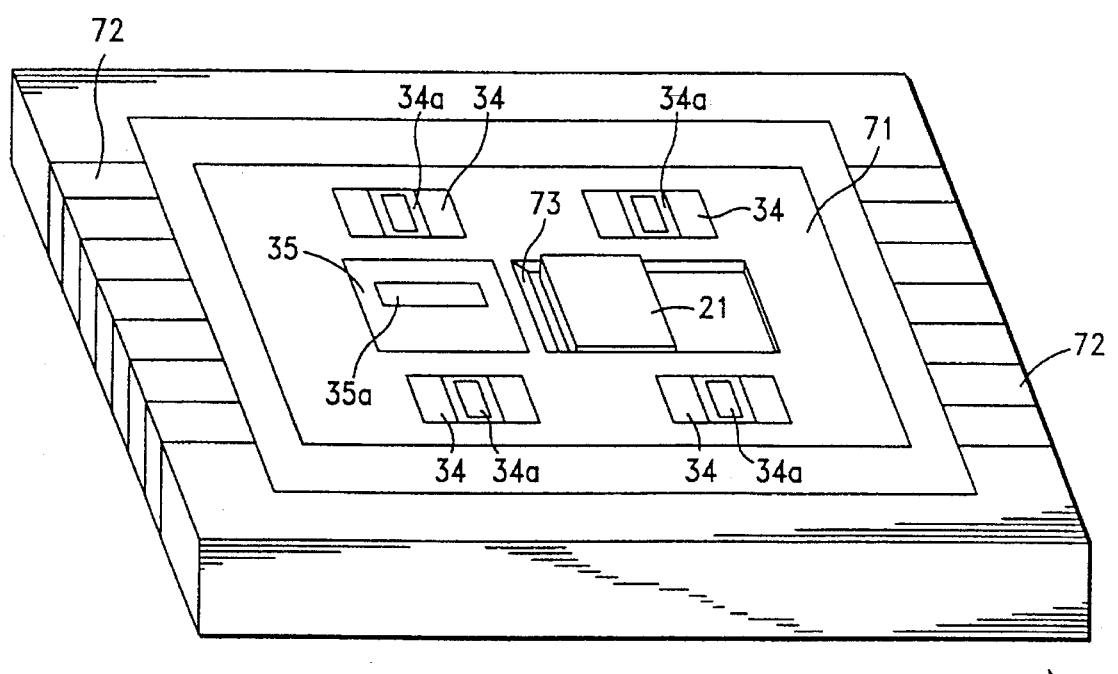
FIG.—13

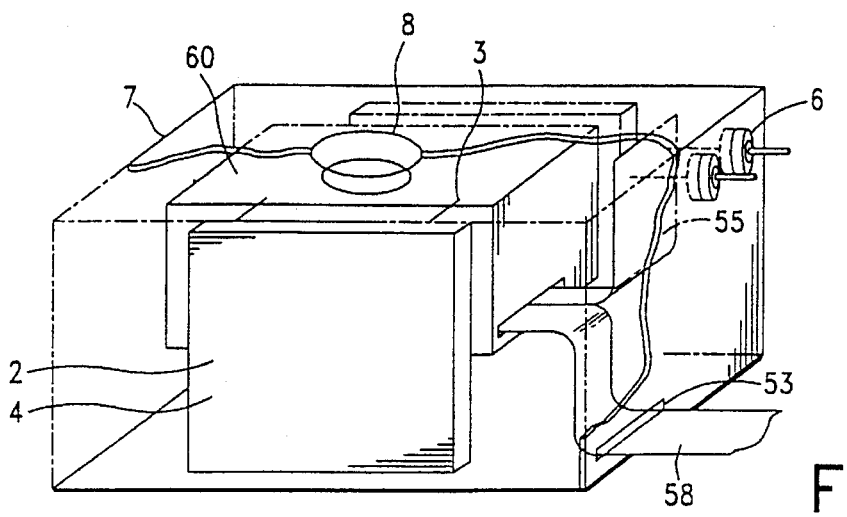
FIG.—21
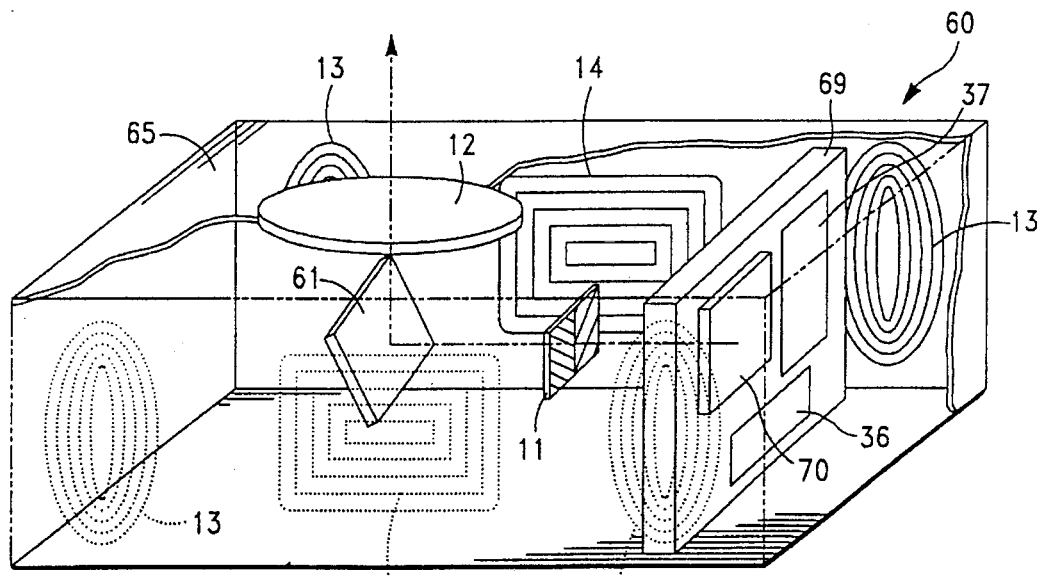
FIG.—22
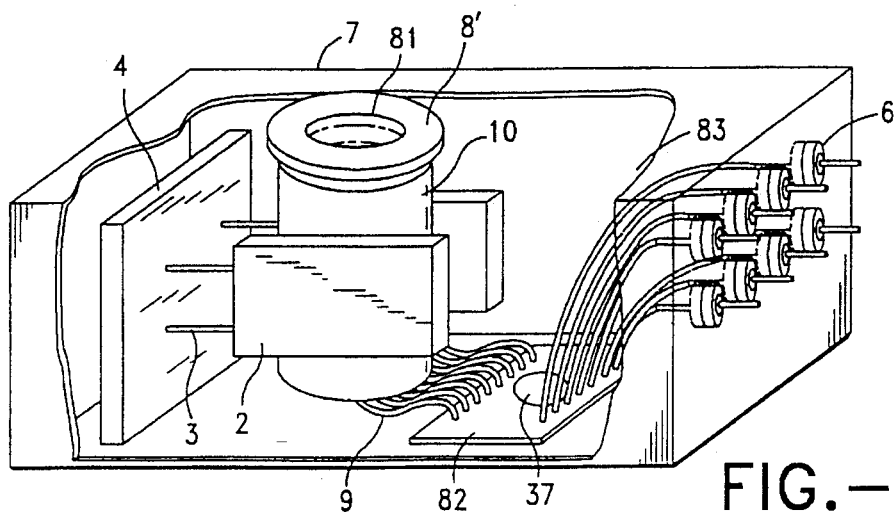
FIG.—23

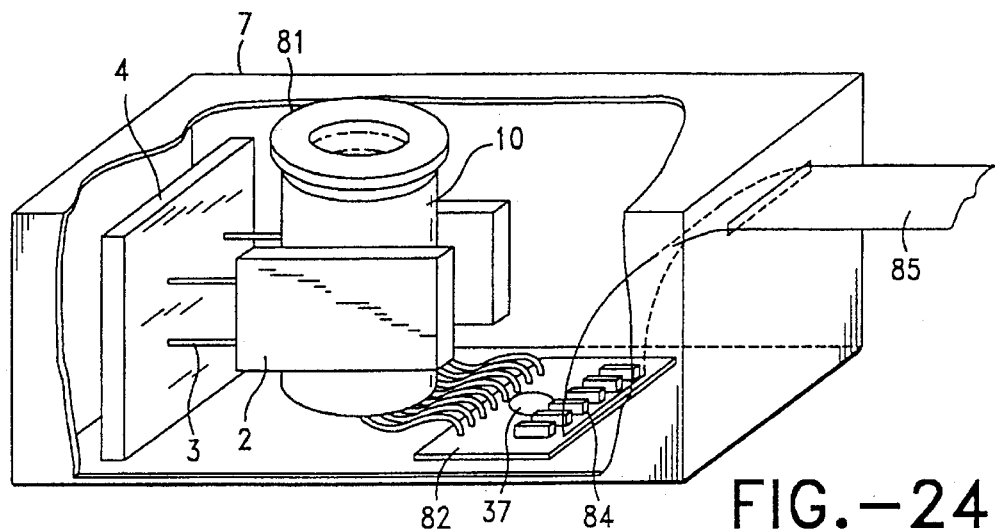
FIG.—24
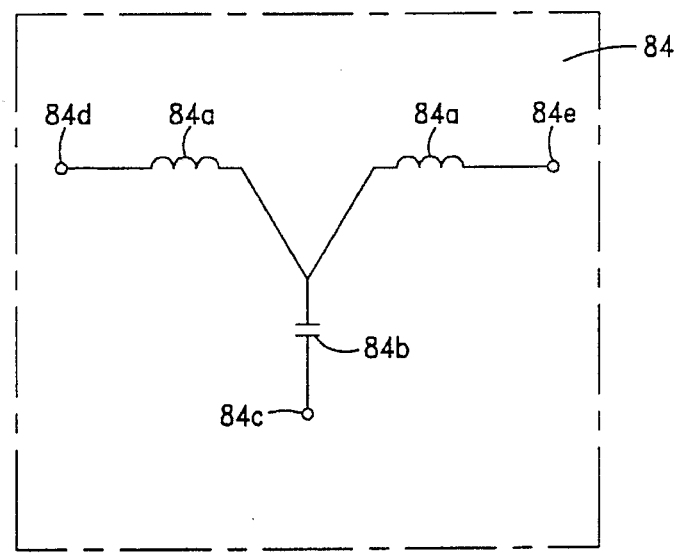
FIG.—25
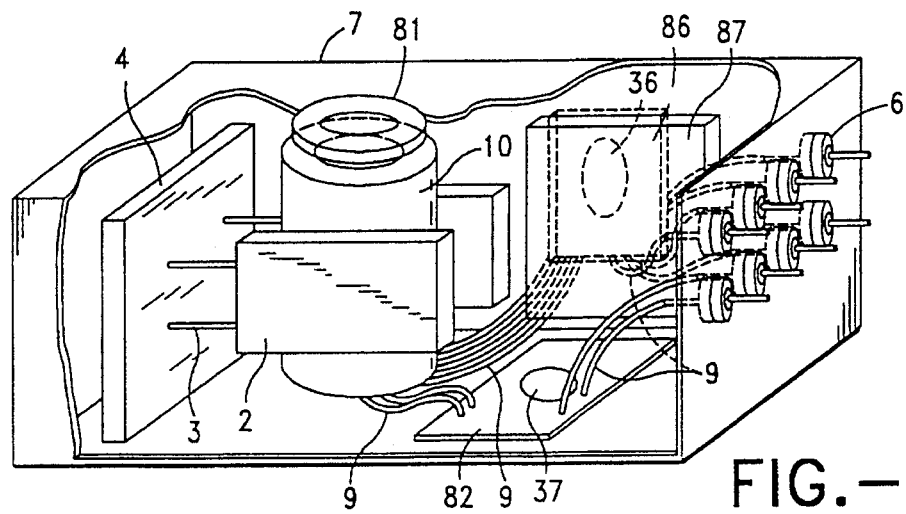
FIG.—26

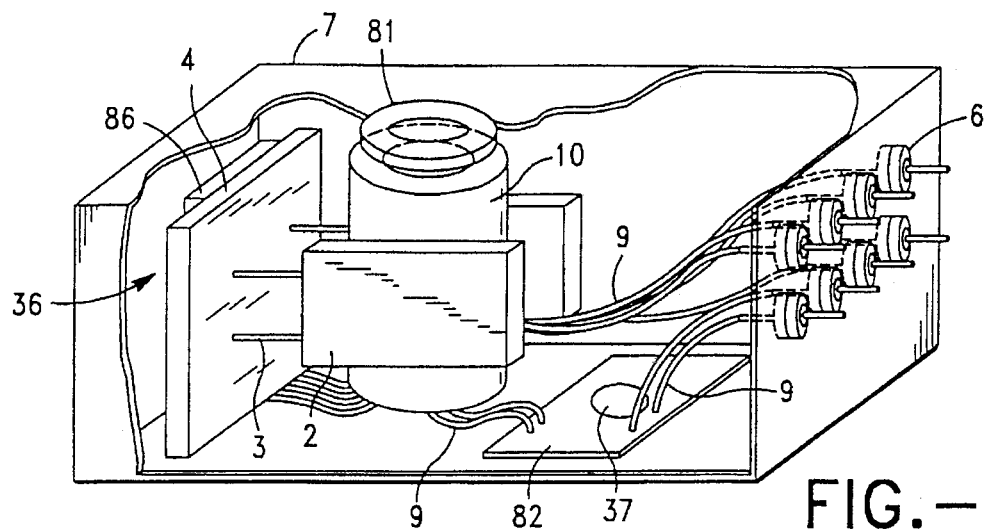
FIG.—27
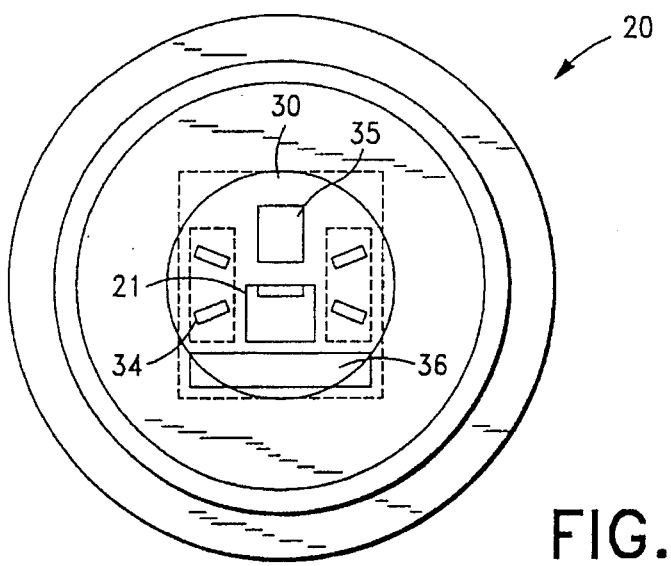
FIG.—29A
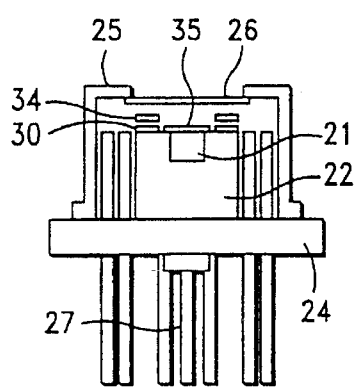
FIG.—29B
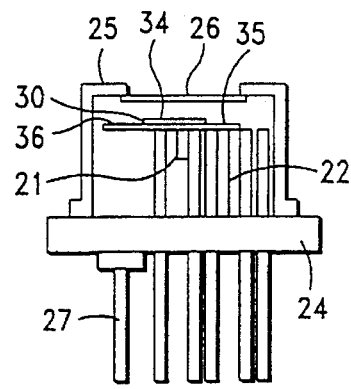
FIG.—29C

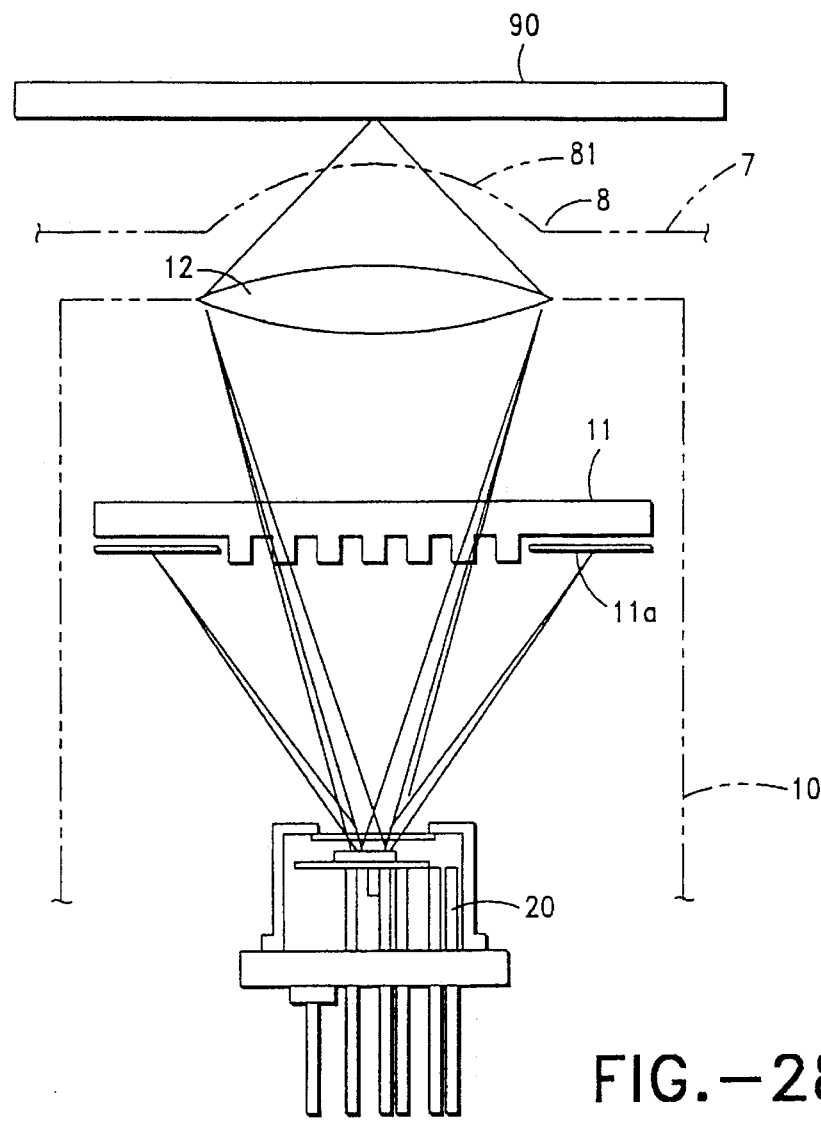
FIG.—28
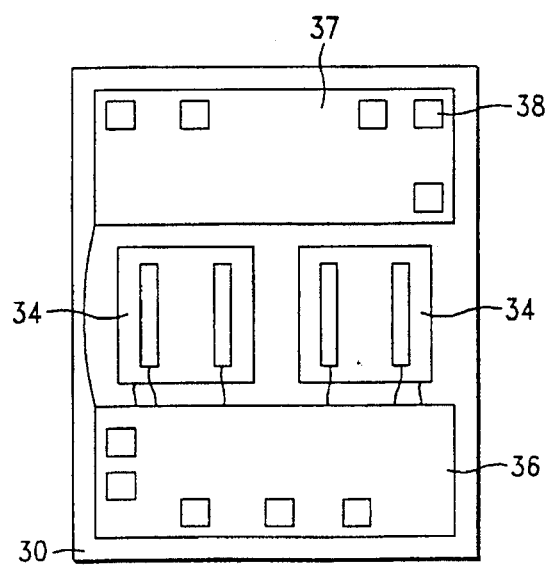
FIG.—36

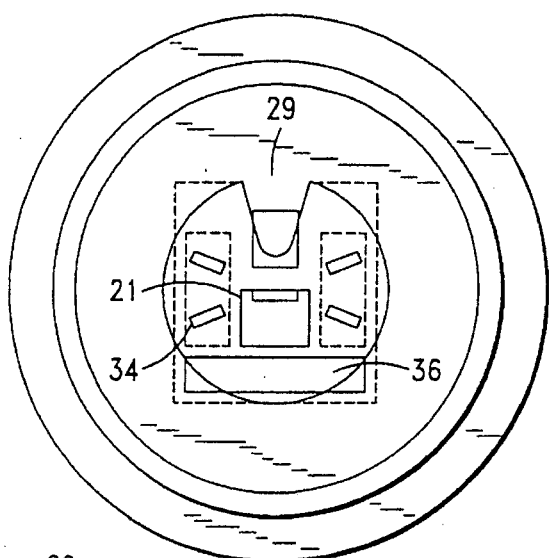
FIG.—31A
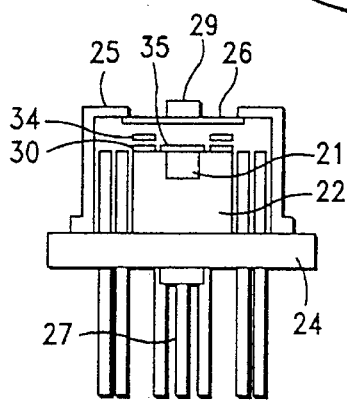
FIG.—31B
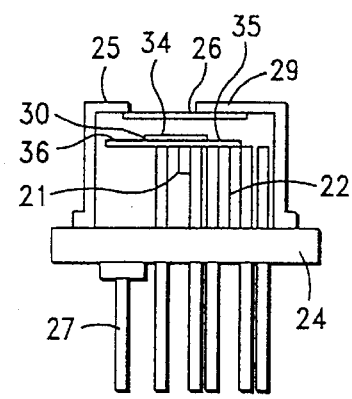
FIG.—31C
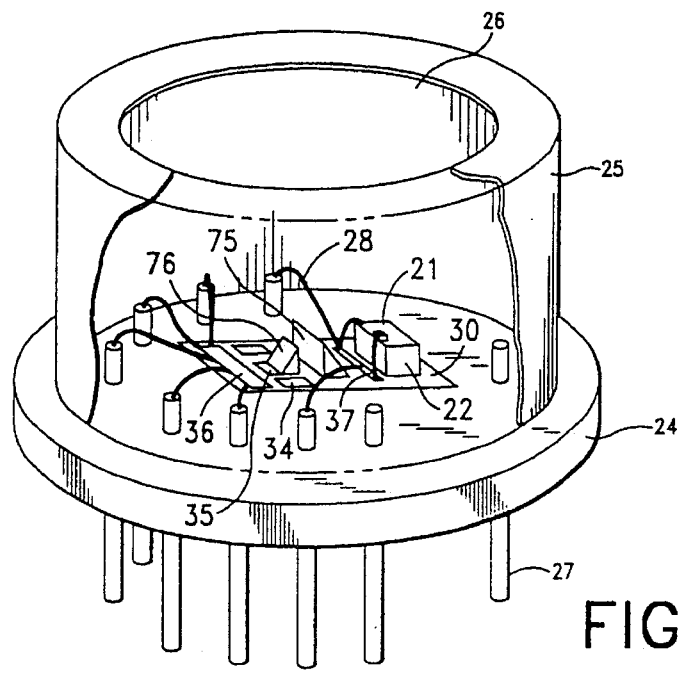
FIG.—32

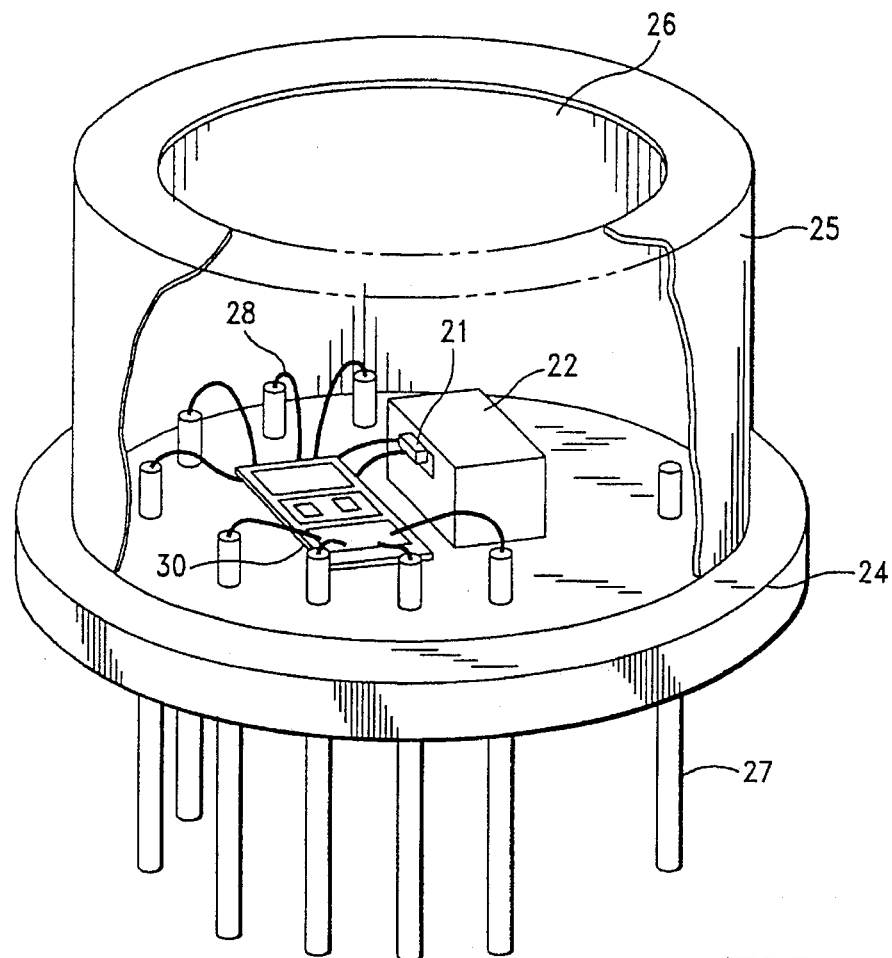
FIG.—35
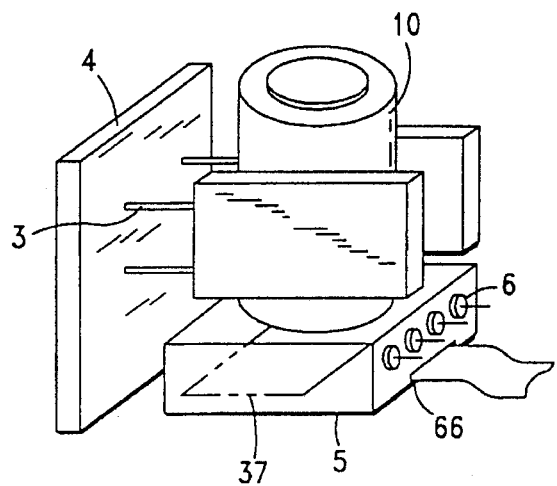
FIG.—38
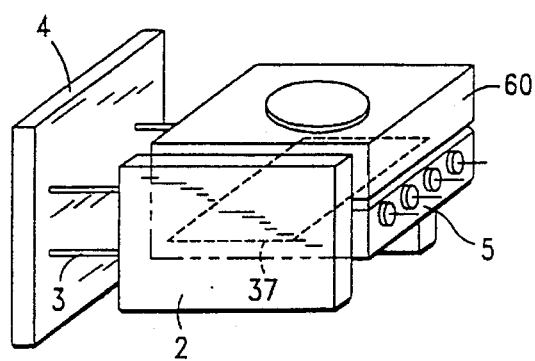
FIG.—39

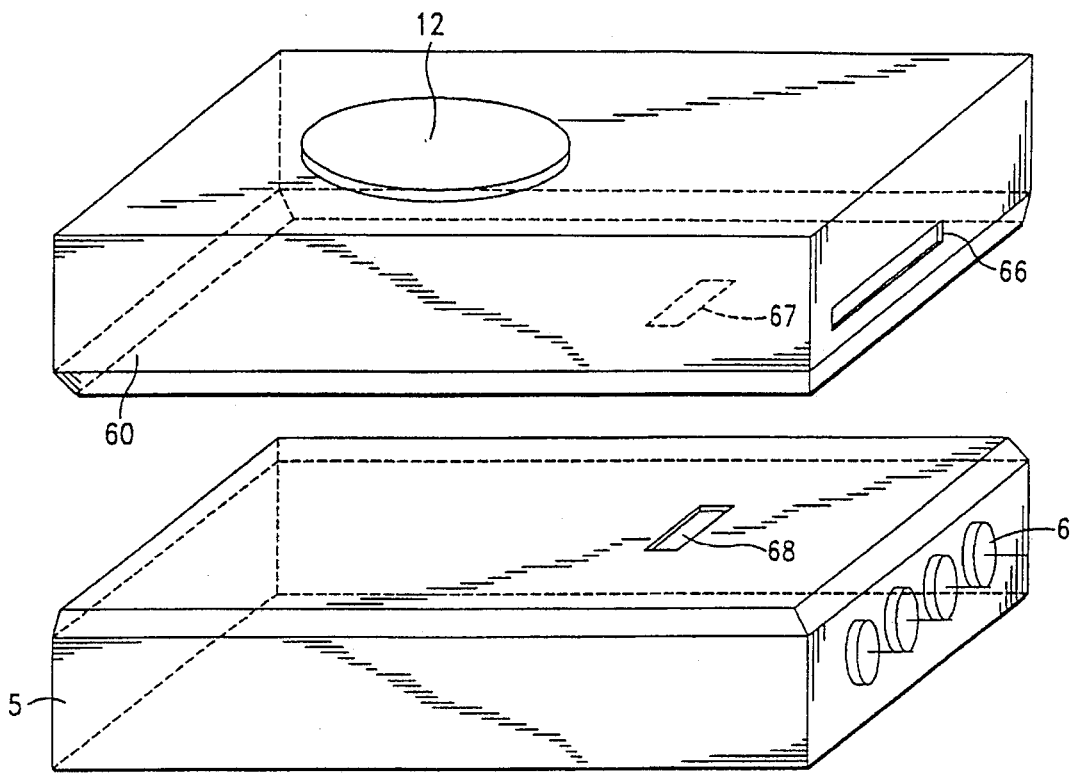
FIG.—40
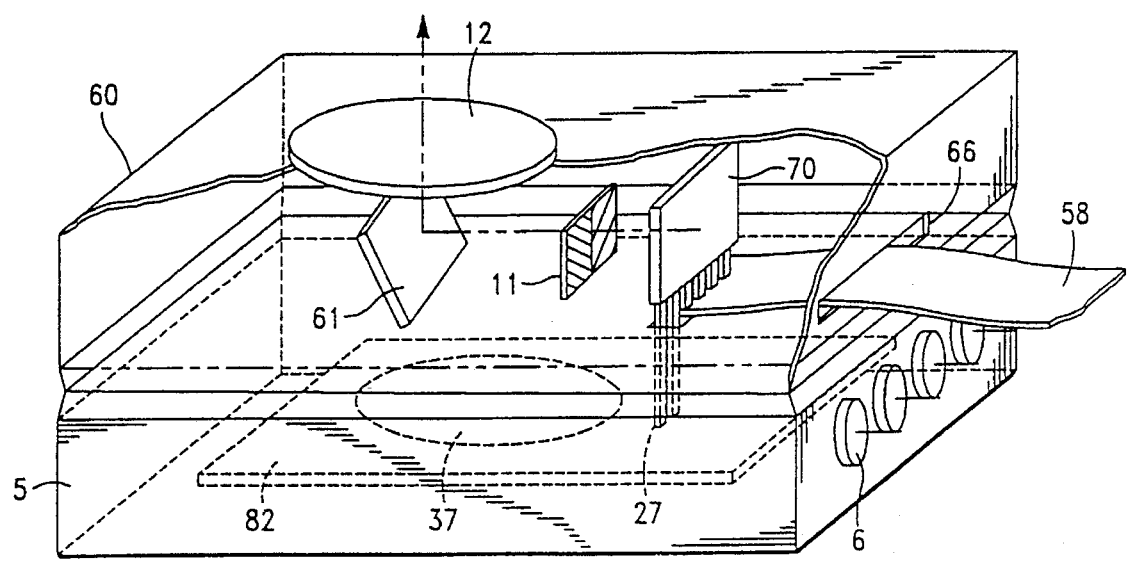
FIG.—41

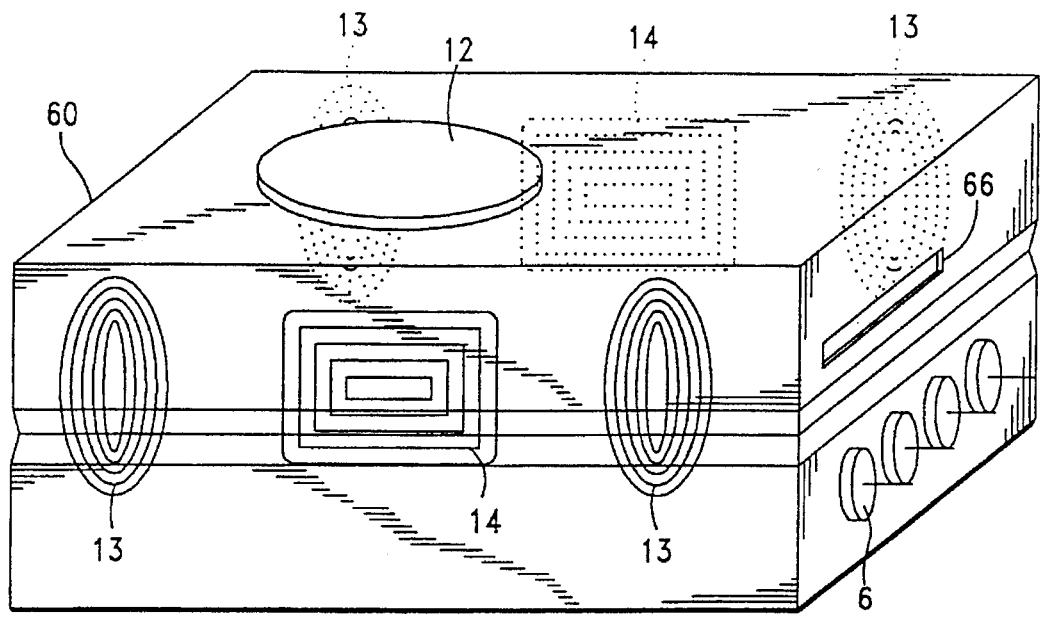
FIG.—42
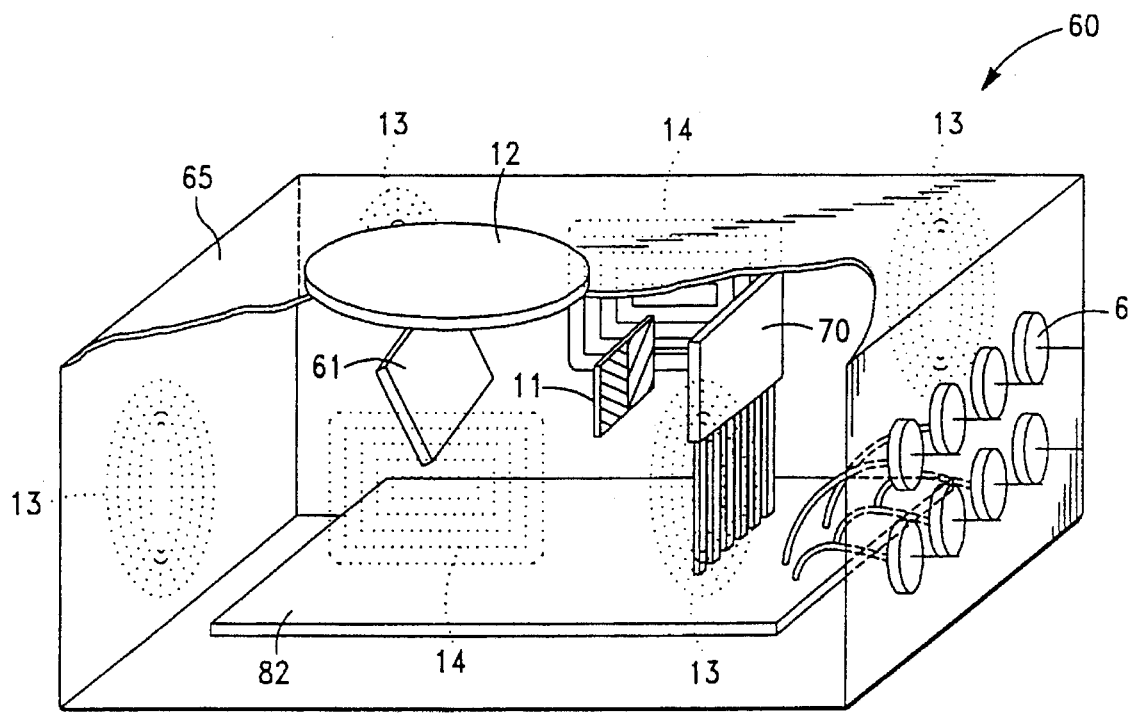
FIG.—43

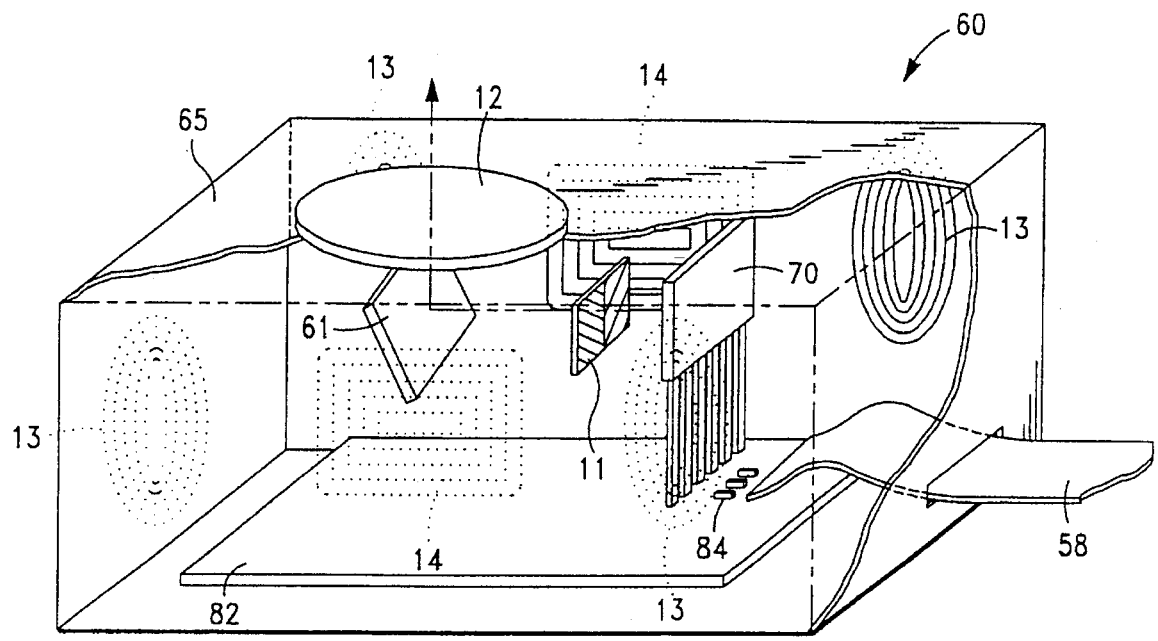
FIG.—44
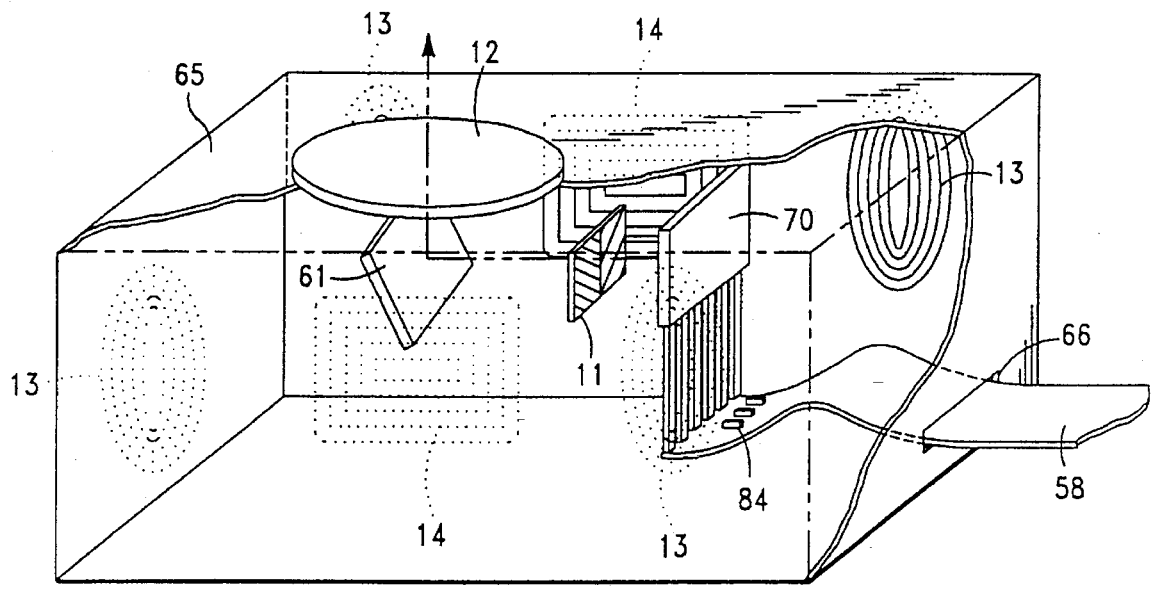
FIG.—45

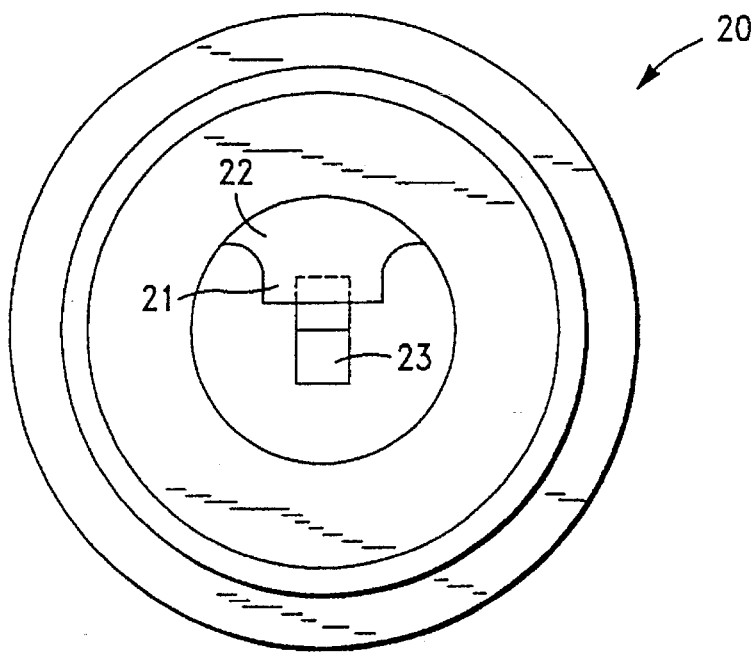
FIG.—47A
(PRIOR ART)
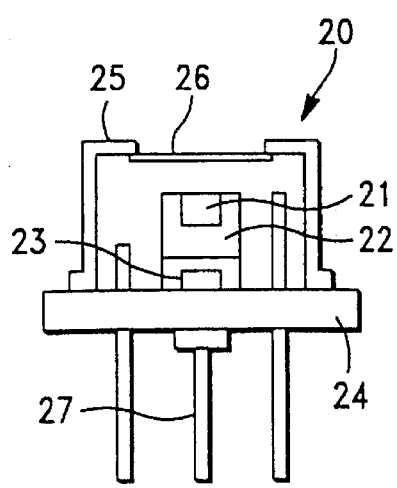
FIG.—47B
(PRIOR ART)
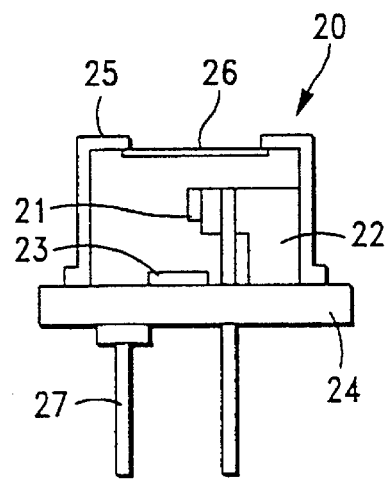
FIG.—47C
(PRIOR ART)

LASER EMISSION UNIT, OPTICAL HEAD AND OPTICAL MEMORY DEVICE

BACKGROUND OF THE INVENTION

This invention relates to an optical head and an associated laser emission unit for reading from and writing into an optical memory medium such as an optical disk or the like, and more particularly to an optical head having a smaller size which is preferably used in an optical memory device of the type having a reduced size and light weight.

In recent years, electric and electronic equipment and devices have been reduced in size. Optical memory devices with an optical memory medium such as an optical disk etc., have also been reduced in size. In order to realize a smaller device, it is important to reduce the size of an optical head because installation and moving space for the optical head can be reduced if smaller optical head is used. Further, if the weight of the small optical head becomes light, transporting mechanism for the optical head can be reduced, and very small memory device can be provided. In addition, if smaller and lighter optical head is used, positioning of the optical head in the memory device can be finely controlled for reading and writing, and writing and reading error can be minimized.

FIG. 46 shows a conventional optical head. In the optical head, a housing 7 contains a laser emission unit 20 with a laser diode. A prism 92 perpendicularly changes the direction of the laser beam emitted from laser emission unit 20 and passing through a collimater lens 94. A laser output power detection element 15 detects a part of the laser beam passing through prism 92 to determine the output power of laser emission unit 20. A diffraction element 11 diffracts a laser beam (returning beam) reflected from an optical disk provided outside of the housing. A data detection element 14 detects a reflected beam diffracted by diffraction element 11. A mirror 61 changes the direction of laser beam angled by prism 92 to an objective lens 12 through which the laser beam is sent out. The returning beam from the optical disk returns into the optical head again via objective lens 12. The returning beam passes through mirror 61, prism 92 and diffraction element 11, and converges on data detection element 14 for detecting a position error signal and recorded signal. Objective lens 12 is supported by a position control mechanism 93 in order to achieve a fine focusing control of the laser beam. Control mechanism 93 is mounted on supporting wall 4 of housing 7 by supporting springs 3. Control mechanism 93 is provided with focusing and tracking coils (not shown). Control mechanism 93 is also provided at both sides with two magnet plates which are located opposite to these coils. Therefore, the position of the position control mechanism can be precisely controlled by applying a current to the coils.

In order to reduce the coherence of the laser beam and to suppress laser noise, it is a usual practice to superpose a high frequency wave component on a driving electrical current supplied to the laser diode. For this purpose, the laser noise reduction element 5 is arranged beside laser emission unit 20. Since noise is likely to leak out from laser noise reduction element 5, laser noise reduction element 5 is enclosed by a shielding case 95 to prevent the noise leakage.

It may be possible to eliminate some of the above elements from the optical head, or to use another method with reduced number of elements having functions equivalent to the functions of some of the above elements, in order to reduce the size of the optical head. In FIG. 47, another laser emission unit is shown. It has a different type of laser power detection element which detects backwardly emitted laser beam for detecting the laser power. This laser emission unit is a canned type unit having a disk-shaped stem 24, a radiator 22 projected from stem 24, a semiconductor laser (laser diode) 21 mounted on the top of radiator 22, a cylindrical-shaped cap 25 covered on stem 24 for protecting laser diode 21 and radiator 22, and a circular emitting window 26 positioned onto the central portion of cap 25. The laser diode is positioned just below the center of window 26 through which the laser beam is emitted. In addition, a laser power detection circuit 23 is disposed on stem 24 for detecting the backwardly emitted laser beam.

When this laser emission unit is used, since the optical head is not provided with a laser power detection element, it can be reduced in size by that amount. However, the power of backward beam is not usually proportional to that of forward beam. Therefore, in order to get the accurate power level, it is necessary to install a power detection element as in the conventional optical head shown in FIG. 46. Hence, up to now, there has not yet been developed an optical head having smaller size while maintaining high performance such as resolution, etc.

As mentioned above, it is important to have smaller optical head in order to provide still smaller optical memory device. However, with the data density becoming higher, performance of optical head must not be degraded.

SUMMARY OF THE INVENTION

Therefore, it is an object of the present invention to provide an optical head of smaller size without degrading its performance. Another object of the present invention is to provide an improved laser emission unit which is preferably used in such a small-sized optical head.

In a laser emission unit according to the present invention, in addition to the function of laser emission, a plurality of functions are integrated. These functions were performed by several elements and/or circuits separately arranged in the conventional optical head. The laser emission unit includes a laser diode and at least one of the following circuits: a laser output power detection circuit for detecting a part of the laser beam forwardly emitted from the laser diode, a signal detection circuit for detecting the laser beam returning to the laser emission unit along substantially the same light path as that of the forwardly emitted laser beam after the beam is reflected at the optical memory medium, and a laser noise reduction circuit for superposing a high frequency wave component on a driving current for driving the laser diode and for reducing the coherence of the laser beam. Furthermore, at least one of these circuits is mounted on a supporting portion of the laser emission unit in addition to the laser diode.

Since there are several embodiments of the laser emission unit, several types of the supporting portion are used. For example, if the unit is of the canned type containing a cylindrical-shaped cap on a stem, the laser diode and the one of the above circuits may be assembled on the stem. If the unit is of the wafer type having the laser diode horizontally arranged on the wafer, the one of the above circuits may be assembled on the same wafer. And, if the unit is of the molded type having the laser diode molded by, for example, molding resin, the one of the above circuits may be molded with the laser diode. By using the above laser emission unit having at least one of the above circuits in addition to the laser diode, it is possible to integrate a plurality of functions which are performed by several elements separately arranged in the conventional optical head. For example, when the laser emission unit contains the signal detection circuit, a data detection element separately disposed in the conventional head can be eliminated, and the size of the optical head of present invention can be reduced easily. Furthermore, since the same light path in the optical head is used by both the emitted laser beam and the reflected laser beam, the space for the light path can be minimized and a smaller-sized optical head can be produced.

Similarly, by using the laser emission unit containing the laser output power detection means in addition to the laser diode, the size of the optical head can be reduced. To accurately detect the emitted power as mentioned above, the laser emission unit includes the laser output power detection circuit for detecting the forwardly emitted laser beam. This forwardly emitted laser beam is directed to the laser output power detection circuit after the light path for a part of the laser beam is changed. To change the light path, a reflecting element is provided on the light path for reflecting a part of the laser beam emitted. A prism for changing the light path of a major part of the emitted laser beam may also be used for directing a part of laser beam to the output power detection circuit. Alternatively, the laser output power detection circuit can detect a part of the laser beam reflected from the diffraction grating. In this case, either a diffraction grating itself or a boundary area of the diffraction grating may be used for reflecting a part of the laser beam. If the boundary area is used for reflecting, it is preferable to apply a reflecting coating on the boundary area. By using a laser emission unit having such laser output power detection circuit as above, it is possible to eliminate the laser output power detection element in the conventional optical head. Therefore, the space for such element is also eliminated. And the space for the light path of the emitted laser beam is shared by that of a partly reflected beam. Hence, the size of the present optical head can be reduced substantially.

When the laser noise reduction circuit is included in the laser emission unit, the space for the laser noise reduction element in the conventional optical head can be eliminated, and a smaller-sized optical head can be produced. In addition, if the laser noise reduction circuit is disposed in a small laser emission unit with the laser diode, the length of the connecting wires between the laser noise reduction circuit and the laser diode can be shortened. Therefore, the amount of the noises leaked out from the wires can be minimized.

It is also possible to include a pre-amplifier circuit in the laser emission unit in addition to the above circuits because the pre-amplifier circuit amplifies signals generated from the laser output power detection circuit and/or the signal detection circuit. Furthermore, the pre-amplifier circuit can process the detected signals to generate position error signals and the like.

It is possible to realize all of these circuits on the same semiconductor wafer because all of these circuits, i.e., the laser output power detection circuit, the signal detection circuit, the pre-amplifier circuit and the laser noise reduction circuit can be constructed or manufactured by the same semiconductor processes. By using the wafer containing these circuits for assembling the laser emission unit, all the above circuits can be assembled in the unit concurrently. Since most steps for assembling the laser emission unit are completed when that wafer is disposed on the supporting portion of the unit, the productivity of the laser emission unit is increased, and the production costs are low. Further, it may be possible to mount the laser diode on the same wafer prior to the assembling of the wafer.

In addition to the reduction of the mounting space as mentioned above, by using the laser emission unit of the present invention, it is possible to reduce the space for the light path and the cabling in the optical head because the laser emitting and receiving parts are integrated in the laser emission unit. Thus, the size of the optical head can be reduced and a very small-sized optical head is produced. Also, since the laser emission unit of this invention is a multi-functional unit, the number of parts for assembling the optical head is small and the number of the assembling steps can be reduced. Therefore, the assembling costs of this optical head can be minimized. It may be further possible to decrease the positional deviations of the parts arranged in the unit during the assembling process and minimize the degrading due to these positional deviations. Therefore, by using the laser emission unit of the present invention, the optical head can have stabilized and higher quality. It may be preferable to put the above circuits on the same board or wafer and to mount the board or wafer in the unit. By using the same board, the optical head including the laser emission unit having the parts positioned precisely can be provided. Thus, the performance of the optical head is maintained at a high level while its size can be reduced. Furthermore, the costs of the optical head can be reduced.

In accordance with the present invention, it may also be possible to pre-assemble the above laser emission unit into lens holder having positioning mechanism for focusing etc. In addition, the lens holder is provided with a diffraction grating and an objective lens. Because many functions are integrated in the lens holder, the number of the assembling parts for the optical head is decreased. Therefore, the size of the optical head can be reduced and also the assembling costs and time of the optical head can be reduced. Further, the assembling errors can also be decreased because of the decrease in the number of the parts.

If it is necessary to suppress the noises leaked from the laser noise reduction circuit and/or the connecting wires attached thereto, the lens holder can be constructed by a shielding member. If the lens holder provides the shielding, the leaked noises can be suppressed without requiring any additional parts such as a shielding plate, etc. It is preferable to use electrically-conductive and non-magnetic material, for example, non-magnetic metal, electrically conducting plastic etc., for the above shielding member because in the lens holder magnetic fields are generated for its position control.

It is possible to dispose the laser reduction circuit in a shielding unit attached to the lens holder, and preferably it should be grounded by connecting it to an earth of the laser emission unit or that of the optical head. If it is necessary to prevent the leakage of the noises from the cables connecting between the laser noise reduction circuit and outside circuits such the circuit supplying the laser driving current etc., a plurality of penetrating capacitors can be used. The capacitors are disposed penetrating through the shielding portion of the lens holder or the shielding unit. A plurality of low pass filters having LC-network can also be disposed in the lens holder or the shielding unit. The low pass filters have an advantage of low cost and require a small space.

It may be possible to use the housing of the optical head having a part of shielding plate in which the lens holder is disposed. It is also possible to cover the laser noise reduction circuit mounted separately in the housing by another shielding plate or by other electrically conductive components of the optical head in order to prevent the noises from entering the pre-amplifier circuit, if necessary.

Another optical head of the present invention has a heat radiating mechanism, such as radiator fins attached to the outside of the lens holder and/or ventilation holes on the housing wall in order to achieve heat dispersion. Since a smaller optical head, which is especially able to emit high power laser beam, usually generates high heat per unit volume, it is preferable to use the heat radiation mechanism. In addition, it may be possible to forcibly vibrate lens holder by using its positioning mechanism in order to spread out the thermal energy. Furthermore, it may be possible to have means for limiting the amount of the laser driving current or for cutting off the laser power.

The optical head according to the present invention may have a position limiter or a stopper for limiting the moving distance to the optical medium in the direction of the emitted laser beam in order to prevent problems such as the destruction of the lens holder due to contacting the optical medium to protect the laser emission unit etc. Furthermore, the optical head of this invention may have a cover on the emitting port of the housing in order to make the housing dust proof and to protect the laser emission unit from malfunction.

Other objects and attainments together with a fuller understanding of the invention will become apparent and appreciated by referring to the following description and claims taken in conjunction with the accompanying drawings.

BRIEF DESCRIPTION OF THE DRAWINGS

FIG. 1 is a perspective view of an optical head according to the first embodiment of the present invention in a partially broken-away state;

FIG. 2 is a perspective view of a lens holder in the optical head of FIG. 1 in a partially broken-away state;

FIG. 3 is a perspective view of a laser emission unit in the lens holder of FIG. 2 in a partially broken-away state;

FIG. 4 is a plan view of a wafer in the laser emission unit of FIG. 3 in a partially broken-away state;

FIG. 5 illustrates the light path of the optical head of FIG. 1;

FIG. 10 is a perspective view of a modified example of the laser emission unit of the first embodiment of the present invention in a partially broken-away state;

FIG. 11 is a perspective view of an optical head according to the second embodiment of the present invention in a partially broken-away state;

FIG. 12 is a perspective view of a lens holder of the optical head of FIG. 11 in a partially broken-away state;

FIG. 13 is a perspective view of a laser emission unit in the lens holder of FIG. 12 in a partially broken-away state;

FIG. 21 is a perspective view of another modified example of the optical head of the second embodiment in a partially broken-away state;

FIG. 22 is a perspective view of a lens holder in the optical head of FIG. 21 in a partially broken-away state;

FIG. 23 is a perspective view of an optical head of the third embodiment of the present invention in a partially broken-away state;

FIG. 24 is a perspective view of a modified example of the optical head of the third embodiment in a partially broken-away state;

FIG. 25 is a circuit diagram of a low pass filter;

FIG. 26 is a perspective view of another modified example of the optical head of the third embodiment in a partially broken-away state;

FIG. 27 is a perspective view of another modified example of the optical head of the third embodiment in a partially broken-away state;

FIG. 28 is an illustration of the light path of the optical head of FIG. 23;

FIGS. 29(a), 29(b) and 29(c) show a plan view and sectional views of the laser emission unit shown in FIG. 28;

FIGS. 31(a), 31(b) and 31(c) show a plan view and sectional views of a modified example of the laser emission unit of the third embodiment;

FIG. 32 is a perspective view of another modified example of the laser emission unit of the third embodiment in a partially broken-away state;

FIG. 35 is a perspective view of the laser emission unit of FIG. 34 in a partially broken-away state;

FIG. 36 is a plan view of a wafer in the laser emission unit of FIG. 35;

FIG. 38 is a perspective view of another modified example of the optical head of the third embodiment in a partially broken-away state;

FIG. 39 is a perspective view of another modified example of the optical head of the third embodiment in a partially broken-away state;

FIG. 40 is a exploded perspective view of the optical head of FIG. 39;

FIG. 41 is a perspective view of the optical head of FIG. 39 with its internal arrangement being shown;

FIG. 42 is a perspective view of the optical head of FIG. 39 with its side arrangement being shown;

FIG. 43 is a perspective view of another modified example of the optical head of the third embodiment in a partially broken-away state;

FIG. 44 is a perspective view of another modified example of the optical head of the third embodiment in a partially broken-away state;

FIG. 45 is a perspective view of another modified example of the optical head of the third embodiment in a partially broken-away state;

FIGS. 47(a), 47(b) and 47(c) show a plan view and sectional views of a laser emission unit of the optical head of FIG. 46 in a partially broken-away state;

DESCRIPTION OF THE PREFERRED EMBODIMENTS

HOUSING OF AN OPTICAL HEAD OF THE FIRST EMBODIMENTS

Figure 6:
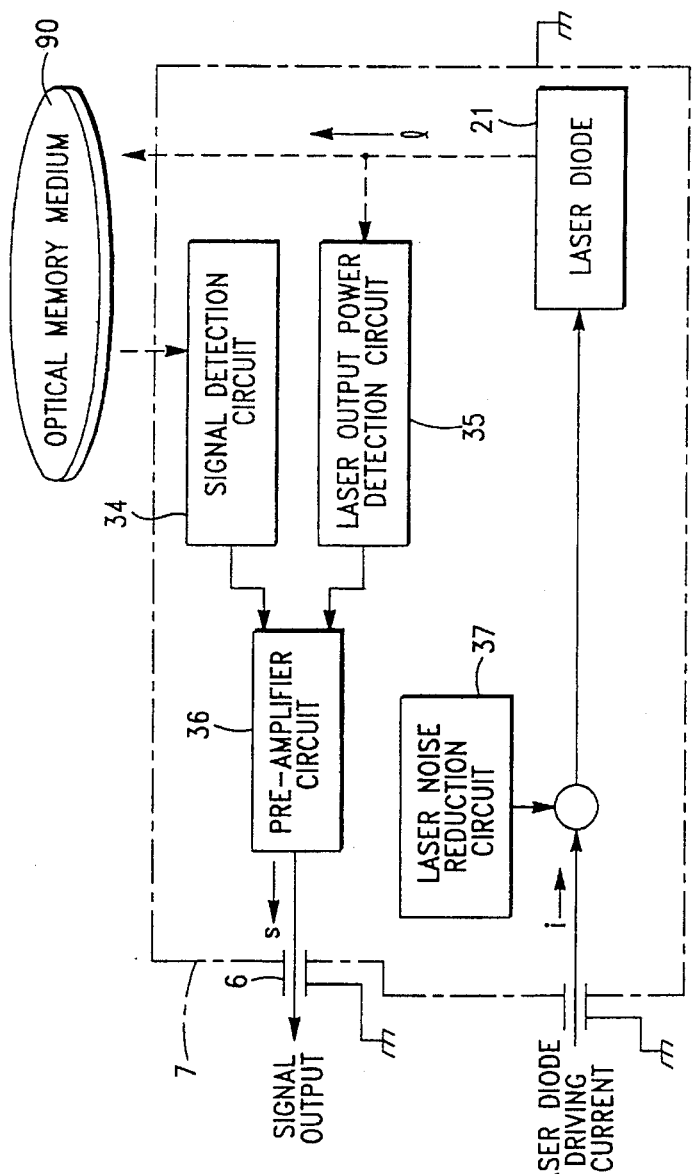
FIG. 6 is a block diagram showing the circuits of the optical head of FIG. 1.

FIG. 1 shows an optical head of a first embodiment in accordance with the present invention. In this figure, a housing of the optical head is illustrated partially broken away for revealing the inner structure of the optical head. An optical head 1 has a housing 7 of a rectangular shape. A round laser emitting port 8 is disposed at the middle area of the upper surface of housing 7. A laser beam passes through port 8. Housing 7 has a function of shielding noise leaked from a laser noise reduction circuit, which will be described below. In order to shield the noise efficiently, housing 7 may be formed of conductive material so as to have its volume resistivity less than $4 \times 10^{-3}$ Ω·cm. Also, it is preferable that the portion of housing 7 formed of the conductive material is connected to the ground of optical head 1 or an earth terminal of a laser emission unit, which will be described below. On the surface of such conductive portion of housing 7, an electric current is generated by the high frequency wave components in the noise generated from the laser noise reduction circuit. The other portion of the energy from the noise is transformed to thermal energy at the surface of the conductive portion. The current generated on the surface is absorbed into the ground and finally transformed to thermal energy. The conductive portion may be made of, for example, metallic material such as aluminum, copper etc. Also, conductive plastic, formed plastic with gilding or with conductive coating can be used. In case magnesium or alloy including magnesium is used, the housing has both high shielding capability and extremely light weight.

Housing 7 has a supporting panel 4 fixed therein. Since cylindrical-shaped lens holder 10 is elastically supported from panel 4 by spring 3, lens holder 10 can move sufficiently in the housing while it is accommodated in housing 7. A pair of magnet plates 2 are located inside housing 7 at the both sides of lens holder 10. Magnetic field for position control of lens holder 10 is generated around by these magnet plates. In lens holder 10, as will be described below, there is disposed a laser diode, the laser noise reduction circuit, etc. A plurality of interconnecting wires 9 extend from the lens holder to the external of housing 7 via a plurality of penetrating capacitors 6. Through these penetrating capacitors, the signal current, such as a driving current supplied from the laser driving circuit located external to optical head 1 are sent.

LENS HOLDER

FIG. 2 shows lens holder 10 of this embodiment. In this figure, a holder cover 15 of the lens holder is illustrated partially broken away for revealing the inner structure of the lens holder. Holder cover 15 is of a cylindrical shape. Holder cover 15 has an objective lens 12 at the center area of upper surface 15a having the shape of a disk. A laser emission unit 20 is disposed on a bottom surface 15b of holder cover 15 in which the laser diode and other circuits are also disposed. A diffraction grating 11 is disposed between laser emission unit 20 and objective lens 12. Holder cover 15 is provided on its cylindrical surface with a focusing coil 13 and tracking coils 14. Focusing coil 13 is coiled around an longitudinal center axis of cylindrical holder 10 and tracking coils 14 are coiled around a transverse axis perpendicular to the longitudinal center axis mentioned above.

A laser beam emitted from laser emission unit 20 mounted in lens holder 10 is focused through objective lens 12 onto an optical memory medium such as an optical disk. The laser beam is reflected at the optical memory medium and returns. The reflected laser beam contains data information and the like. The reflected laser beam from the optical memory medium returns into lens holder 10 via objective lens 12 again. In lens holder 10, the reflected beam is diffracted by diffraction grating 11 and led into laser emission unit 20.

Focusing coil 13 and tracking coils 14 are disposed on lens holder 10 in order to precisely control the position of lens holder 10. The position of the laser beam is controlled by other means not including coils 13 and 14, such as a track positioning control mechanism (not shown in the figures), when the laser beam travels a long distance, such as in a seek operation relative to a track of the optical disk which will be referred to as optical memory medium. However, to detect the data stored on the optical disk, it is necessary to control precisely a focusing location and a tracking location of a detecting spot of laser beam. In this lens holder 10, the focusing location can be finely controlled by focusing coil 13 by means of a magnetic field generated by applying current to focusing coil 13. This magnetic field generated from coil 13 interacts with the magnetic field of magnet plates 2, and the position of lens holder 10 along its longitudinal axis can be controlled. Also, the tracking location can be controlled precisely by tracking coils 14 by means of a magnetic field generated by applying current to tracking coils 14. The position of lens holder 10 along an axis perpendicular to its longitudinal axis can be controlled with the cooperation between the magnetic fields generated by coils 14 and magnet plates 2. After optical head 1 is positioned on a certain place on a track having data marks to be read, the laser beam is controlled by coils 13 and 14 so as to focus it precisely on the data marks. Then the data marks on the optical disk are scanned by the laser beam and the data is read out.

Since the diameter of emitting port 8 on housing 7 is smaller than the outer diameter of lens holder 10, lens holder 10 cannot be pushed out from housing 7 if the position of holder 10 is changed beyond the limit span toward the optical disk due to an unexpected event. Since the window 8 serves as a stopper, destruction of optical head 1 and lens holder 10 is prevented. Damage on the recording surface of the optical disk is also prevented.

LASER EMISSION UNIT

FIG. 3 shows a laser emission unit 20 which is mounted in lens holder 10 of this embodiment and is of canned type.

Laser emission unit 20 comprises a disk-shaped stem 24, a radiator 22 projected upon stem 24, and a semiconductor laser (laser diode) 21 disposed on the top of radiator 22. Radiator 22 is used to prevent laser diode 21 from being damaged by overheating. The laser diode and the radiator are protected by a cylindrical-shaped cap 25 against physical damage. Cap 25 has a round window 26 at center of its upper surface. The laser beam is emitted from laser diode 21 through the window.

On stem 24 of this laser emission unit 20, there is provided a wafer 30 including a plurality of circuits, such as a signal detection circuit, laser output detection circuit, a pre-amplifier circuit and a laser noise reduction circuit. Also, stem 24 has a plurality of bar type electrodes 27 which penetrate through stem 24 from inside to outside of laser emission unit 20. At the inside of unit 20, electrodes 27 are connected to other electrodes on wafer 30 via bonding wires 28. At the outside of unit 20, electrodes 27 are connected to wires 9 which extend from lens holder 10 as shown in FIG. 1. Laser diode 21 is connected to wafer 30 via bonding wires 28.

FIG. 4 depicts wafer 30 which has a rectangular shape. The wafer provides on its center area with laser output power detection circuit 35 including photodiode 35a disposed at the center of circuit 35 for detecting the laser beam and for confirming the laser output power. Wafer 30 provides beside output power detection circuit 35 with a plurality of signal detection circuits 34 disposed opposite to each other. Each of signal detection circuits 34 has a pair of photodiode 34a and 34b for detecting the returning beam. In addition, wafer 30 has a pre-amplifier circuit 36 disposed on one end of wafer 30. Pre-amplifier circuit 36 amplifies signals generated by laser output power detection circuit 35 and/or signal detection circuit 34. Also, wafer 30 has a laser noise reduction circuit 37 disposed on its other end opposite to pre-amplifier circuit 36. These circuits 34, 35, 36 and 37 are connected to electrodes 27 and laser diode 21 by bonding wires 28 attached to electrodes 38 formed on wafer 30.

Laser output power detection circuit 35 detects a portion of the laser beam forwardly emitted from laser diode 21 and transforms the laser beam energy into a current signal. Although there are some methods for changing the direction of forwardly emitted laser beam toward circuit 35, in the optical head described herein, the laser beam partly reflected from diffraction grating 11 is used for detection circuit 35. The details will be described below.

Signal detection photo diodes 34a and 34b detect the laser beam reflected from the optical disk after the beam has been diffracted by diffraction grating 11. The photo diodes transform the reflected beam energy to current signals. The signals generated by signal detection circuit 34 are processed for determining the values of the position error and recorded information.

Pre-amplifier circuit 36 converts the current signals generated from signal detection circuit 34 and/or laser output power detection circuit 35 into voltage signals. Then the pre-amplifier circuit amplifies the voltage signals up to a level sufficient for sending them to other circuits and devices. At the same time, since the output electrical impedance of pre-amplifier circuit 36 is decreased by using an operational amplifier, etc., the output signal of pre-amplifier circuit 36 can be prevented from being mixed with noises, and the band width does not decrease. In addition, pre-amplifier circuit 36 can process the signals supplied from the photo diodes of signal detection circuit 34 to generate signals such as focusing position differential signals, recorded data signals and other signals. Since pre-amplifier circuit 36, output power detection circuit 35 and signal detection circuit 34 are disposed on the same wafer 30, as shown in FIG. 4, the length of the wires interconnecting these circuits is very short. Therefore, the possibility of mixing the signals with the noise, which may occur when the signals are provided to pre-amplifier circuit 36, can be reduced.

Laser noise reduction circuit 37 has a high frequency generator and a buffer amplifier. The laser noise reduction circuit superposes a high frequency wave component on the driving current for driving laser diode 21 before the driving current is supplied to the hot side of laser diode 21. When the high frequency wave component is superposed on the driving current, the value of the driving current is modulated in a short period of time. Hence, the wavelength of emitted laser beam is altered in accordance with the modulation of the driving current, and the coherency of laser beam can be decreased. Thus, laser noise due to the reflected beam can be suppressed. In laser emission unit 20 shown in FIG. 3, since laser noise reduction circuit 37 is mounted on wafer 30 beside laser diode 21, the length of the connecting wires between laser diode 21 and circuit 37 is shortened and the surface area through which the noise may be leaked can be decreased.

As mentioned above, laser emission unit 20 shown in FIG. 3 has wafer 30, on which output power detection circuit 35, signal detection circuit 34, pre-amplifier circuit 36 and laser noise reduction circuit 37 are arranged. Thus, it is not necessary to have several independent elements in the optical head in order to perform the functions of the above four circuits. Therefore, the arrangement of the optical head becomes very simple, and the size of the optical head can be reduced. In addition, the production costs can be reduced. Since the four circuits 34, 35, 36 and 37 can be made on the same wafer by the same semiconductor manufacturing process, manufacturing time and costs can be decreased in comparison with those of the conventional optical head in which a plurality of elements for performing the functions of the above four circuits 34, 35, 36 and 37 are located separately. In addition, since a small number of parts are necessary for assembling the optical head, it can be assembled in fewer steps than those for manufacturing the conventional optical head. Furthermore, the assembling of this optical head is simple. Since photo diode 35a for detecting the laser output power and photo diodes 34a and 34b can be manufactured by semiconductor process on the wafer, diodes 35a, 34a and 34b can be formed on the wafer with high accurate relative locations, shapes and dimensions. In order to include all of these circuits in small laser unit 20 with the laser diode, it is preferrable to keep the relative distances accurately. Hence, the wafer shown in FIG. 4 is most suitable for small-sized laser unit 20 of this invention because on the wafer a plurality of circuits are made by the semiconductor process. By using the wafer having these circuits, it is very easy to keep the predetermined locations accurately during the assembling of the laser unit. Therefore, the performance of the laser emission unit is higher and more stable. Also, a small optical head with high accuracy and high performance is obtained.

In FIG. 5, the arrangement of the optical head of the first embodiment is illustrated. The laser beam goes through diffraction grating 11 after it is emitted from the laser diode in laser emission unit 20. Then it passes objective lens 12 and emitting port 8 of housing 7 sequentially. Finally the laser beam is focused on the recording surface of optical disk 90. Since on the diffraction grating 11 the surface opposite to the diffraction grating surface has no anti-reflection means such as anti-reflection coating and has approximately 4% reflectivity, a part of the laser beam emitted from the laser diode is reflected back to laser emission unit 20. In laser emission unit 20, the above reflected beam is detected by photo diode 35a in laser output power detection circuit 35. Since laser output power detection circuit 35 can detect a part of laser beam emitted forwardly from laser diode 21, the power which is actually focused on the disk can be confirmed accurately.

The laser beam comes back into lens holder 10 passing emitting port 8 of housing 7 after it is reflected from the data mark located on the optical disk. This reflected beam is diffracted by diffraction grating 11. Then it is astigmatically converged on photo diodes 34a and 34b for detecting the beam containing the position error signal and the data signal from the surface of the optical disk.

The reflected returning beam is detected by photo diodes 34a and 34b, and is then converted to current signals. The current signals are amplified and processed by pre-amplifier circuit 36 and are then sent to the outside of optical head 1 via bonding wires 28, electrodes 27, wires 9 and penetrating capacitors 6.

The driving current for driving laser diode 21 is supplied from the outside of optical head 1 to laser noise reduction circuit 37 arranged on wafer 30 via penetrating capacitors 6, wires 9, electrodes 27 and bonding wires 28 sequentially. The driving current is then supplied to the laser diode via bonding wires 28 after the high frequency wave component is superposed on it at laser noise reduction circuit 37.

In FIG. 5, as mentioned above, laser emission unit 20 includes, not only laser diode 21, but also laser output power detection circuit 35, signal detection circuit 34, pre-amplifier circuit 36 and laser noise reduction circuit 37. Therefore, the size of optical head 1 according to this invention becomes much smaller than that of the conventional head in which a plurality of elements performing the functions of the above circuits are arranged separately. Also, the optical head of this invention has the advantages of minimizing production costs and time and upgrading the quality because it can be assembled from a small number of parts. In addition to the above advantages, since the emitting and receiving of the laser beam are integrated in the laser emission unit, the path for laser beam, i.e., the light path of emitting beam and that of reflecting beam, can be commonly allocated in the lens holder in the optical head. Therefore the space for these light paths can be reduced. Hence, the size of the optical head is much smaller. Further, since a part of the emitting laser is reflected by the diffraction grating and the path of this reflected beam can be common to that of the emitting beam, the space for the light paths is further reduced and a smaller optical head can be produced.

FIG. 6 is a block diagram of circuits for the above optical head 1. The laser diode driving current i is supplied from a laser driving circuit (not shown in this figure) to the laser diode after being superposed with the high frequency wave component generated from laser noise reduction circuit 37. The diode is driven by this superposed current, and the laser beam 1 is emitted. A part of laser beam 1 is reflected at diffraction grating 11 and the power of the laser beam is detected by laser output power detection circuit 35. On the other hand, the data beam reflected from the optical disk is detected by signal detection circuit 34. Output signals from power detection circuit 35 and signal detection circuit 34 are supplied to the downstream after they are amplified and converted from current to voltage signals in pre-amplifier circuit 36. In this way, they can be easily handled by some circuits downstream. Also, the pre-amplifier circuit can have the functions of generating the position error-differential signals and other data information signals from the optical medium. These circuits are enclosed by housing 7 having shielding function. As shown in FIG. 1, wires 9 extend outside housing 7 from the lens holder passing through penetrating capacitors 6 formed on a wall of housing 7. Therefore, the noises leaked out of laser noise reduction circuit 37 can be shielded, and their influence on other devices and equipment is minimized.

Figure 7:
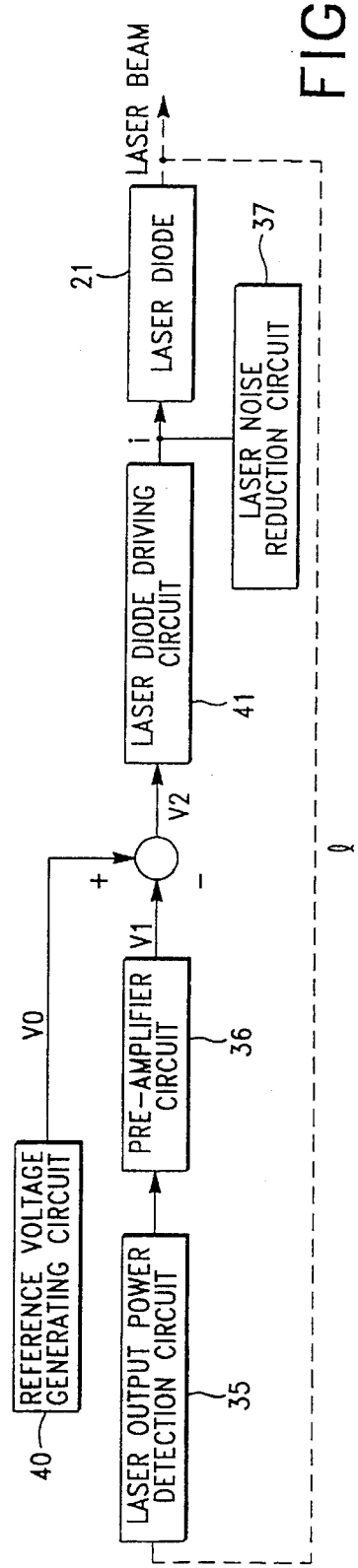
FIG. 7 is a block diagram showing the flow of the current for driving the laser diode in the optical head of FIG. 1.

FIG. 7 illustrates a control mechanism for the laser power using power detection circuit 35. First, a reference voltage $V_0$ is generated from a reference voltage generating circuit 40. The current signal generated from laser power detection circuit 35 is converted to a voltage signal at pre-amplifier circuit 36. This voltage signal is inverted to become an output voltage $V_1$. Then voltage $V_1$ is added on to reference voltage $V_0$ and a laser control signal voltage $V_2$ is produced. This laser control signal $V_2$ is supplied to a laser diode driving circuit 41 which generates the laser driving current i in accordance with laser control voltage $V_2$. As mentioned before, the driving current i is supplied to the laser diode after it is superposed with the high frequency wave component supplied from laser noise reduction circuit 37. Then, the laser beam is emitted from the laser diode in accordance with the value of the driving current i. A part of laser beam is again detected by laser power detection circuit 35.

When the power of the laser beam is above a predetermined value, the value of the current signal generated by laser power detection circuit 35 is increased. Then, voltage $V_1$, which is inverse of the voltage signal from pre-amplifier circuit 36 is decreased. Hence, the voltage level of laser output control signal $V_2$ is also decreased, and in accordance with voltage $V_2$, the driving current i becomes low. Therefore, the power of the emitted laser beam is decreased according to the current i. On the other hand, when the power of the laser beam is below the predetermined value, the inverse of voltage $V_1$ is increased, and voltage $V_2$ is also increased. In accordance with the value of voltage $V_2$, the amount of the laser driving current i is increased. Thus, the power of the laser beam emitted from the laser diode is also increased. Therefore, the control mechanism shown in FIG. 7 can effectively control the laser power so as to keep it constant by using the reference value $V_0$.

Figure 8:
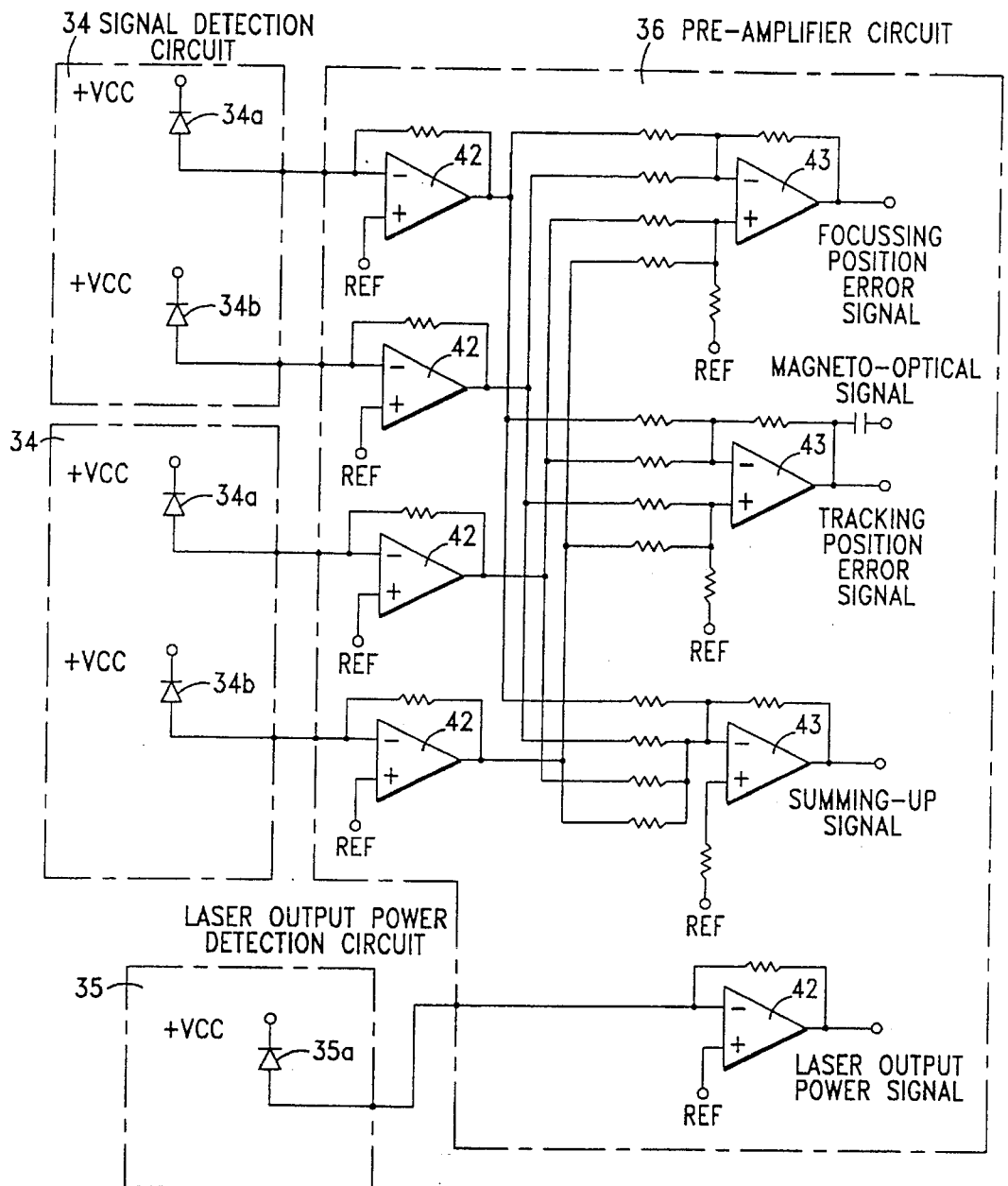
FIG. 8 is a circuit diagram of a signal detection circuit, laser output power detection circuit and pre-amplifier circuit for the optical head of FIG. 1.
Figure 9:
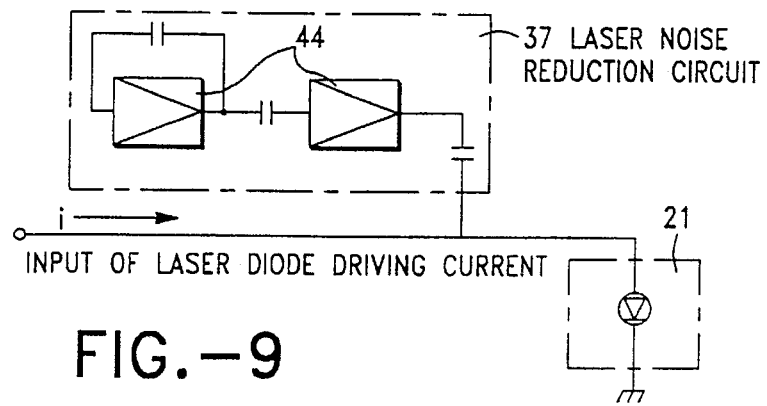
FIG. 9 is a circuit diagram of a laser noise reduction circuit for the optical head of FIG. 1.

FIGS. 8 and 9 show the arrangement of circuits 34, 35, 36 and 37. Each of two signal detection circuits 34 has two photo diodes 34a and 34b to which a high voltage $V_{cc}$ is connected. Power detection circuit 35 has a photo diode 35a to which high voltage $V_{cc}$ is also connected.

As shown in FIG. 8, pre-amplifier circuit 36 generates position error signal, etc. The current signals supplied from the four photo diodes 34a and 34b are output by three operational amplifiers 43 after the current-voltage conversion and the amplification by four operational amplifiers 42. In circuit 36, an error signal for focusing position is generated by the astigmatism method, and an error signal for tracking position is generated by the push-pull method. Circuit 36 produces and sends out a recording signal stored in the optical disk (if a magneto-optical disk is used, a magneto-optical recording signal is sent out) and a signal containing total intensity.

As shown in FIG. 9, laser noise reduction circuit 37 includes a high frequency wave generator and a buffer amplifier, each of which includes a high frequency band amplifier 44. The output from laser noise reduction circuit 37 is added through a capacitor to the driving current i for driving laser diode 21. The driving current with a high frequency wave component is supplied to the anode (hot side) of laser diode 21.

FIG. 10 shows a modified example of laser emission unit 20' which can be mounted in lens holder 10 of FIG. 2. Laser emission unit 20' has a wafer 30a containing laser output power detection circuit 35, signal detection circuit 34 and pre-amplifier circuit 36. Laser emission unit 20' has another wafer 30b containing laser noise reduction circuit 37. Wafer 30a is disposed on the top of radiator 22. Wafer 30b is disposed on the side of radiator 22 next to laser diode 21. In this arrangement of laser unit 20', bonding wires 28 are easily connected between wafers 30a, 30b and electrodes 27. Since the distance between laser diode 21 and laser noise reduction circuit 37 is shorter and the length of bonding wires 28 connecting circuit 37 and laser diode 21 is also shorter, the amount of noise leaked out of circuit 37 is reduced.

HOUSING OF AN OPTICAL HEAD OF THE SECOND EMBODIMENT

FIG. 11 shows an optical head of a second embodiment according to the present invention. A housing 7 and supporting panel 4 of this optical head 1 are partly broken away to disclose the internal arrangement of optical head 1. Housing 7 of optical head 1 has a rectangular shape and can shield noise, as the housing in the first embodiment. In addition, this housing 7 has a plurality of ventilating holes 51 on an upper surface 7a and lower surface 7b. In housing 7, there is provided a lens holder 60 having a rectangular shape, and supporting panels 4 for supporting lens holder 60. Magnetic field is generated around lens holder 60 by panels 4, which serve as magnetic plates 2a and 2b. Since lens holder 60 and supporting panels 4 are joined by elastic means such as spring 3, lens holder 60 is flexibly movable, and the position of the lens holder is finely controllable. A laser emitting hole 8 is located above an objective lens 12 on lens holder 60. The diameter of hole 8 is smaller than the outer dimension of lens holder 60. Therefore, hole 8 can act as a stopper against lens holder 60.

Lens holder 60 includes a plurality of radiator fins 62 having a rectangular shape on its two opposite side panels. A fiat cable 55 extends from lens holder 60 through an area between a side panel of housing 7 and magnet plate 2b. Laser noise reduction circuit 37 is disposed on cable 55. Cable 55 extends to a side wall of housing 7 and is connected to a plurality of penetrating capacitors 6 from which wires extend to the outside of housing 7.

From lens holder 60, another fiat cable 56 extends through an area between a side panel of housing 7 and magnet plate 2a. Flat cable 56 is connected to a board 57 in housing 7, and pre-amplifier circuit 36 is arranged on board 57. Output cable 58 from pre-amplifier circuit 36 extends outside of housing 7 through a slit 53 formed on a side panel of housing 7. In the housing, a temperature sensor 59 is disposed and connected to output cable 58 via board 57.

Since optical head 1 of this embodiment has ventilation holes on the housing, and lens holder 60 has radiator fins 62, a temperature increase due to heat generated from the laser emission unit (as will be described later) can be suppressed within a limited range. It is preferable for smaller optical head to keep the temperature increase below the limited value, because the temperature of the small optical head tends to be relatively high due to the heat generated in the laser unit. Especially, for an optical head using a laser unit capable of emitting high power laser, it should be desirable to prepare some means for radiating the heat accumulated therein and to prevent malfunctions which may happen because of the degrading of the performance of the laser diode or other circuits due to the high ambient temperature. In addition, optical head 1 can implement another heat radiating method. In this heat radiating method, the internal temperature of the housing is monitored by temperature sensor 59. When the internal temperature exceeds a predetermined value, lens holder 60 is forcedly vibrated for further cooling. This cooling method will be explained later.

Since pre-amplifier circuit 36 is disposed on board 57 in housing 7 and they are not disposed in a laser emission unit, the tuning of pre-amplifier circuit 36 can be done easily when a fine tuning is required for amplifying or generating the signals from the laser power detection circuit or the signal detection circuit. Similarly, the tuning of laser noise reduction circuit can be done easily. In these cases, the circuits located in housing 7 can be arranged either on the board like the pre-amplifier circuit, or on the fiat cable like the laser noise reduction circuit. Thus, the space in the housing can be reduced if the circuits are arranged on fiat cables, because fiat cables can be flexibly disposed on any area such as complicated shaped area.

LENS HOLDER

In FIG. 12, lens holder 60 in the above optical head 1 has a holder cover 65 of a rectangular shape. The lens holder includes an objective lens 12 on its upper wall and a plurality of radiator fins 62 on its two opposite side walls. In addition, the lens holder has focusing coils 13 and tracking coils 14 both of which are disposed on the longer side surfaces of cover 65 facing against magnet plates 2a and 2b respectively. A laser emission unit 70 of a rectangular shape having a diffraction grating 11 and a mirror 61 is arranged in holder cover 65.

The laser beam emitted from laser emission unit 70 goes through diffraction grating 11. The light path of this laser beam is changed upward by mirror 61 before the laser beam passes through objective lens 12. On the other hand, a reflected laser beam from an optical disk or other optical memory medium returns to laser emission unit 70 along the same light path but in the reverse direction, i.e., along the path sequentially from objective lens 12, to mirror 61 and diffraction grating 11. The reflected laser beam is astigmatically converged on laser emission unit 70 as in the first embodiment described before. Also, the position of lens holder 60 can be precisely controlled by focusing coils 13 and tracking coils 14 in the same manner as in the first embodiment. In lens holder 60 of this embodiment, laser emission unit 70, diffraction grating 11 and mirror 61 are arranged in a line along the longitudinal direction of lens holder 60, which is perpendicular to the direction of the laser beam to be emitted from the lens holder. Therefore, the thickness of the lens holder in the direction of the laser emission can be reduced. Hence, the thickness of the optical head can be reduced and the total dimension of the optical head is small.

LASER EMISSION UNIT

As shown in FIG. 13, laser emission unit 70 in the above lens holder 60 of optical head 1 has a wafer 71 which has a rectangular shape. A plurality of terminals 72 are disposed around wafer 71. A laser diode 21 is disposed on the central area of wafer 71. Also, a laser output power detection circuit 35 including a power detecting photo diode 35a is arranged on the central area of wafer 71 beside laser diode 21. Four signal detection circuits 34, each including a signal detecting photo diode 34a, are arranged on the two sides of wafer 71 in parallel with laser diode 21 and power detection circuit 35. A reflection surface 73 is arranged between laser diode 21 and laser power detection circuit 35 for vertically changing the light path of the laser beam emitted from laser diode 21 before the beam leaves perpendicularly to the surface of wafer 71.

Therefore, the direction of the laser beam emitted from laser diode 21 is changed before emitting perpendicularly to the plane of laser emission unit 70 corresponding to wafer 71. Laser output power detection circuit 35 detects partially reflected laser beam from diffraction grating 11 in the same manner as in the first embodiment. Signal detection circuits 34 detect reflected laser beam passing through diffraction grating 11 after the beam is reflected off the optical disk and returns along the light path mentioned above. In this embodiment, the signals from signal detection circuits 34 and laser power detection circuit 35 are sent to pre-amplifier circuit 36 disposed outside of laser emission unit 71 via terminals 72 etc. In pre-amplifier circuit 36, the signals are current-voltage transformed and are output. On the other hand, the laser driving current is supplied to laser diode 21 on wafer 71 by the laser noise reduction circuit 37 via flat cable 55 and terminals 72. The laser diode is driven by the current.

Since laser emission unit 70 contains circuits 34 and 35, along with laser diode 21 on wafer 71, lens holder 60 and optical head 1 having this unit 70 can be assembled easily in a short period of time. The manufacturing costs of unit 70 can thus be reduced. Because the laser emitting part (laser diode 21) and laser receiving parts (photo diodes 34a and 35a) are assembled on identical wafer 71, the positional relationship between these parts can be precisely controlled at the manufacturing stage. Thus, the laser emission unit will be accurate and have fairly stable quality. Although pre-amplifier circuit 36 and laser noise reduction circuit 37 are disposed outside of laser emission unit 70, they may also be assembled on wafer 71.

Since the laser emission part and laser receiving parts are integrated on laser emission unit 70, the length of the light path in lens holder 60 and optical head 1 can be shortened and a small-sized optical head can be obtained. Especially, in this embodiment, the thickness of the optical head is very thin because the thin-sized lens holder 60 is used. Further, since pre-amplifier circuit 36 and laser noise reduction circuit 37 are disposed outside laser emission unit 70 in housing 7, the tuning of these circuits can be done easily for manufacturing, if necessary, to offset the deviations of each laser diode etc. In optical head 1 of this embodiment, a flat cable is used. Cables can be flexibly used in any space, and on the cable circuits can be arranged. Therefore, some spaces required for connecting or mounting of the circuit boards can be eliminated, thus the size of the optical head can be minimized. In addition, in this embodiment, these cables are actually shielded from each other because lens holder 60 and magnet plates 2a and 2b are disposed in the spaces between these cables. Therefore, pre-amplifier circuit 36 is relatively free from the noises generated from laser noise reduction circuit 37. This arrangement may be preferable in a case where the noise power from laser noise reduction circuit 37 is very high, or where pre-amplifier circuit 36 cannot stand weak noises because of higher data density to be read and/or written.

In this embodiment, the lens holder has heat radiator fins 62 in order to increase the surface area contacting with the air and achieve effective heat radiation. Moreover, housing 7 has the ventilation holes. It is preferable for optical head 1 with these arrangements to emit a high power laser beam, because the excessive temperature increase can be reduced at lens holder 60, laser noise reduction circuit 37 and pre-amplifier circuit 36. In optical head 1, lens holder 60 always moves up and down according to the deflection of the optical disk in order to focus the laser beam by position control mechanism. For example, in an optical memory disk device, lens holder 60 moves up and down in the direction of the laser beam in the same timing as the periodic movement of the surface of the optical disk. Because of such actions of lens holder 60, air in housing 7 is mixed and the heat generated is absorbed by the air. At the same time, the air in the housing is exchanged via ventilating holes. Therefore, the temperature increase in housing 7 can be suppressed within the limited range. It is preferable to use magnesium for housing 7 to achieve more effective heat radiation because magnesium has a low weight and high thermal conductivity.

Figure 14:
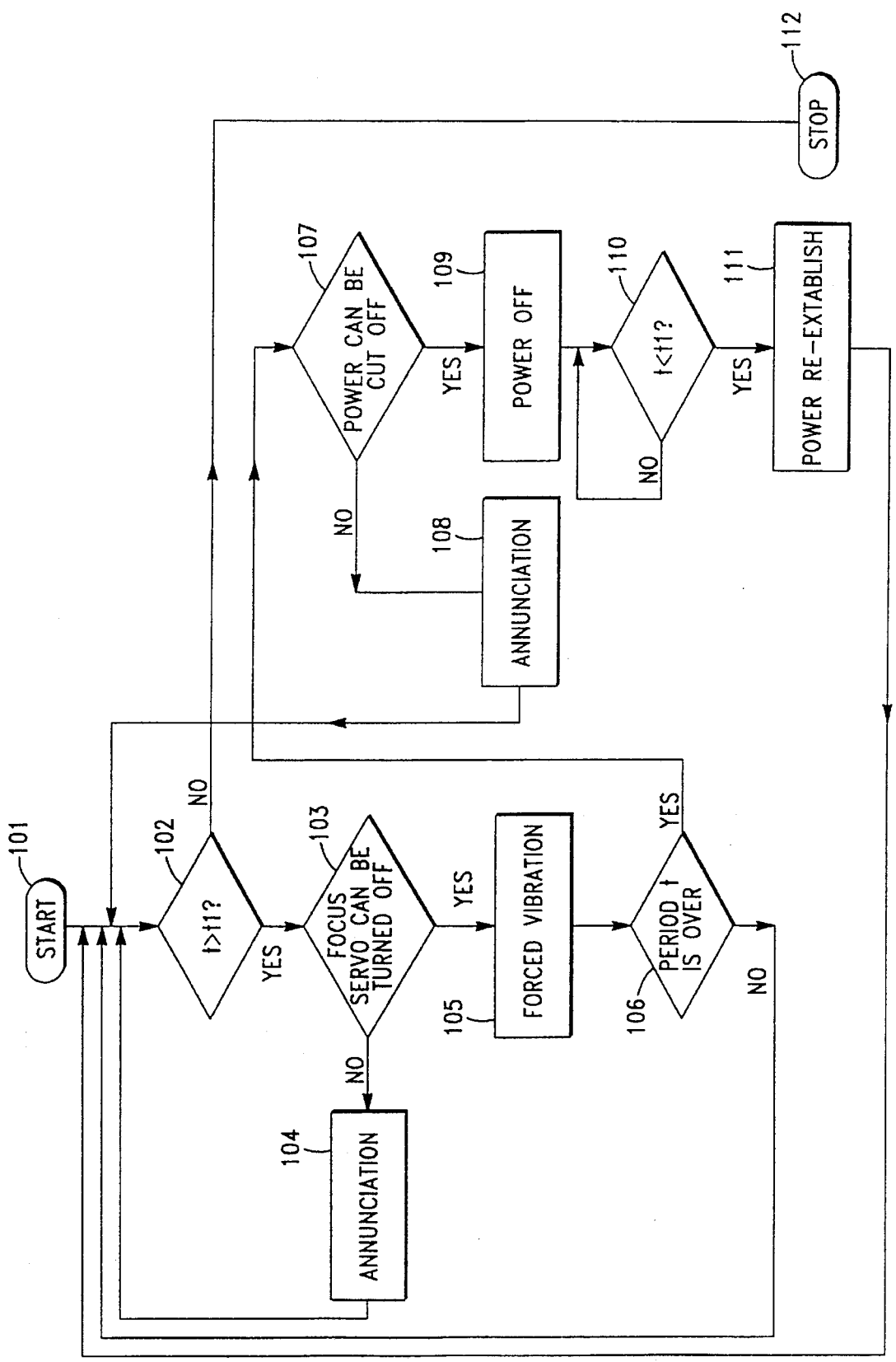
FIG. 14 is a flow diagram showing the control sequence for the optical head of FIG. 11.

Furthermore, the optical head of this embodiment implements a method to reduce the temperature increase. In this method, lens holder 60 is forcedly vibrated in accordance with the temperature monitored. FIG. 14 shows the control sequences.

At step 101, the sequence of temperature control is started. At step 102, the temperature t of the optical head is detected to determine whether the temperature t exceeds a predetermined limited value t1. The temperature t is the ambient temperature of optical head housing 7 and is measured by temperature sensor 59. If the temperature t is below the value t1, this sequence moves to step 112 and quits.

If the temperature t is larger than the limited value t1, the judgement is made at step 103 to determine whether the focusing servo can be turned off. In an optical memory device, the focusing servo is required for data writing and/or reading, but it is not required in other states and can be turned off. If the focusing servo cannot be turned off in an operating state of device, it is impossible to turn lens holder 60 into the forced vibrational mode. Thus, at step 104, a warning signal is generated and the sequence returns to step 102 where the temperature t is again monitored.

If the focusing servo can be turned off, at step 105, lens holder 60 is forcedly vibrated by the focusing servo mechanism such as coils and magnet plates, so that the air in the housing can be mixed up and the temperature t inside the housing can be decreased. In a period τ, lens holder 60 is kept in the forced vibrational mode. During this period, the time interval is measured at step 106 and the temperature t is continuously evaluated at step 102. When the temperature t is below the limited value t1, the control sequence moves to step 112 and lens holder 60 gets out of the forced vibrational mode.

After the period τ, if the temperature t is still higher than the limited value t1, at step 107, the sequence checks whether the electrical power supplied to laser noise reduction circuit 37 can be shut off. In other words, the judgement is made whether pre-amplifier circuit 36 and lens holder 60 can be inactivated. If the electrical power can be shut off, it is possible to turn these circuits into halt condition and the heat generated from these circuits can be reduced. In case where the electrical power cannot be shut off, at step 108, the sequence generates a warning signal and then returns to step 102 to take some actions such as monitoring the temperature t and turning the lens holder into forced vibration.

In case where the electrical power can be shut off, at step 109, the supply of the electrical power is stopped by the sequence. Then at step 110, the temperature t is detected to determine if the temperature t is below the limited value t1. When the temperature t is below the limited temperature t1, at step 111, the electrical power is turned on. Then the sequence returns to step 102 where the temperature t is monitored.

Although, not shown in the flow chart in FIG. 14, it is possible to set another limited value t2 which is higher than the limited value t1. And it may be possible to provide a control so that as soon as the temperature t exceeds the limited value t2, the electrical power supplied to the optical head is turned off. This sequence is preferable for preventing the destruction and miss operation of the optical head due to excessive temperature increase.

Figure 15:
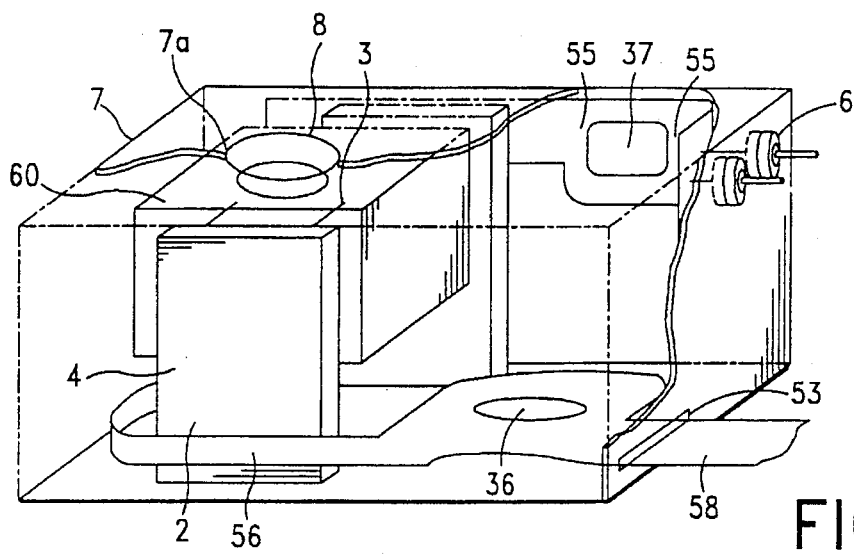
FIG. 15 is a perspective view of a modified example of the optical head of the second embodiment in a partially broken-away state.

In FIGS. 15 to 21, variations of optical head 1 of this embodiment are shown. In FIG. 15, a modified optical head 1 is shown. The optical head has pre-amplifier circuit 36 disposed on fiat cable 56. Thus, the connection between the cable and pre-amplifier circuit 36 can be eliminated and assembling time can be saved. Additionally, the space for mounting circuit 36 can be reduced.

Figure 16:
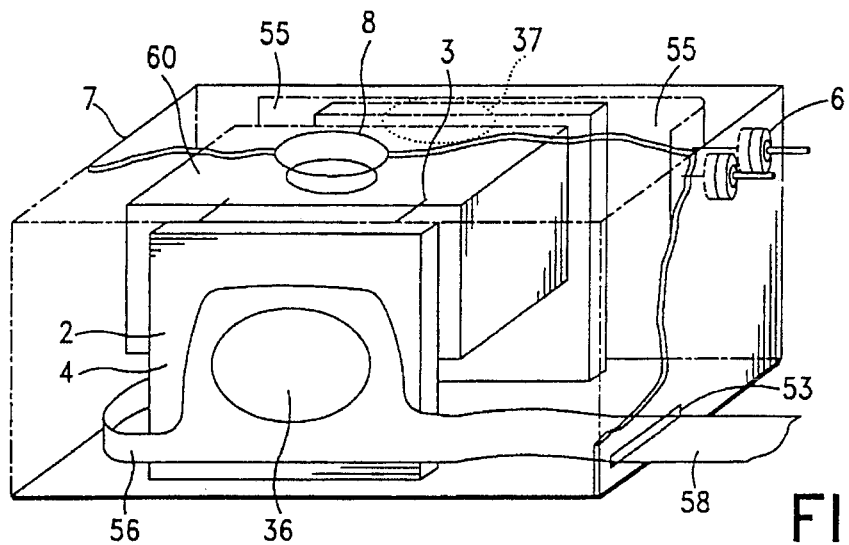
FIG. 16 is a perspective view of another modified example of the optical head of the second embodiment in a partially broken-away state.

In FIG. 16, another modified optical head 1 is shown. In the optical head, laser noise reduction circuit 37 is disposed on fiat cable 55 and positioned between a side wall of housing 7 and magnet plate 2b. Pre-amplifier circuit 36 is disposed on flat cable 56 and positioned between another side wall of housing 7 and the other magnet plate 2a oppositely arranged relative to plate 2b. Thus, lens holder 60, magnet plates 2a and 2b shield between laser noise reduction circuit 37 and pre-amplifier circuit 36 and are electrically and magnetically isolated. Accordingly, because of lens holder 60 and magnet plates 2a, 2b, the interferences between circuit 36 and circuit 37 can be reduced. Therefore, optical head 1 in FIG. 16 is preferred for treating weak signal against noise. In this optical head 1, since circuits 37 and 36 are mounted between the side walls of housing 7 and magnet plates 2a, 2b, a smaller-sized optical head can be produced.

Figure 17:
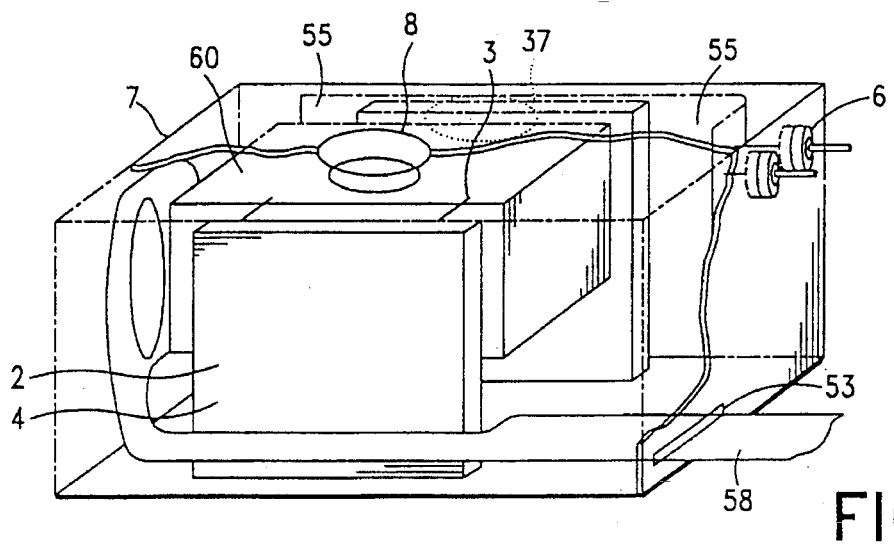
FIG. 17 is a perspective view of another modified example of the optical head of the second embodiment in a partially broken-away state.

In FIG. 17, another modified optical head 1 is shown. In this optical head, pre-amplifier circuit 36 is disposed on fiat cable 58 positioned near lens holder 60 and one of side wall of housing 7 away from magnet plates 2a, 2b. In this arrangement, the length of the fiat cable connecting between pre-amplifier circuit 36 and lens holder 60 can be shortened. Thus, the possibility of adding noises into the signals sent by cable 58 is reduced. Thus, the pre-amplifier circuit can receive relatively clear signals having low noises.

Figure 18:
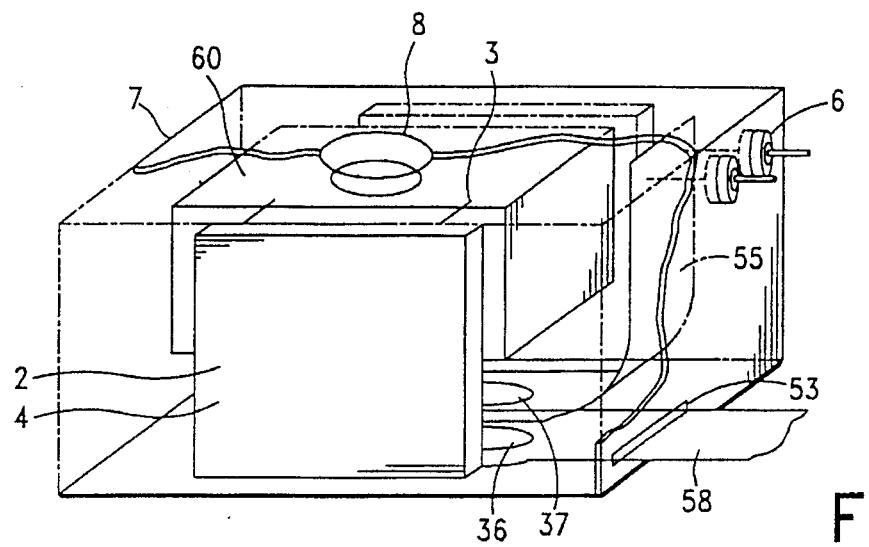
FIG. 18 is a perspective view of another modified example of the optical head of the second embodiment in a partially broken-away state.

In FIG. 18, another modified optical head is shown. In this optical head, laser noise reduction circuit 37 is disposed on fiat cable 55 and pre-amplifier circuit 36 is disposed on fiat cable 58. Circuits 36 and 37 are arranged under lens holder 60. In this arrangement, the length of both cable 55 connecting between laser noise reduction circuit 37 and lens holder 60 and cable 58 connecting between pre-amplifier circuit 36 and lens holder 60 is shorter. Hence, it is possible to reduce the noises generated from laser noise reduction circuit 37 and to minimize the possibility of adding the noises into pre-amplifier circuit 36. Since both circuits 36 and 37 are located in a residual space between housing 7 and lens holder 60, a smaller and especially shorter optical head can be produced.

Figure 19:
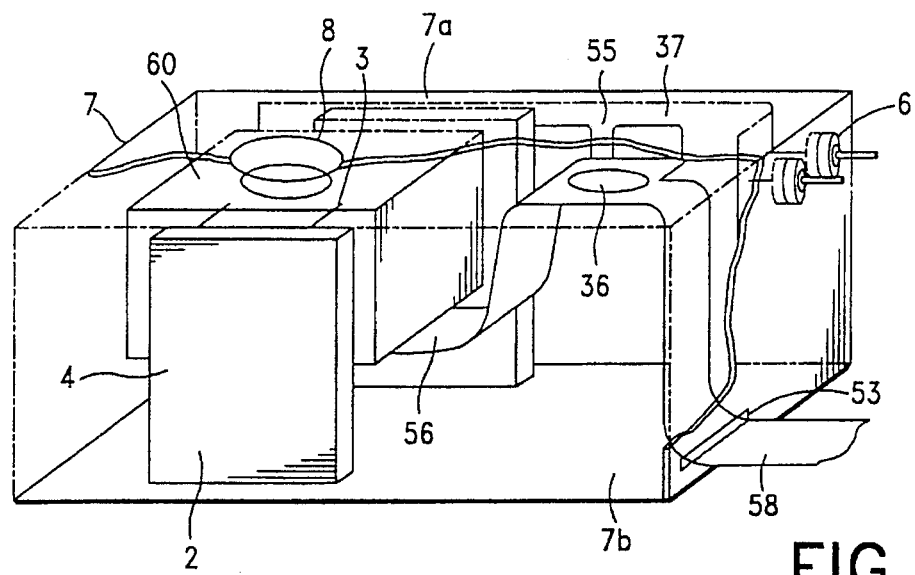
FIG. 19 is a perspective view of another modified example of the optical head of the second embodiment in a partially broken-away state.

In FIG. 19, another modified optical head 1 has pre-amplifier circuit 36 disposed on fiat cable 58, and located just below upper surface 7a of housing 7 through which the laser beam is emitted. Therefore, the tuning of pre-amplifier circuit 36 is easier from the upper surface if necessary. In addition, other circuits, if necessary, can be mounted below circuit 36.

Figure 20:
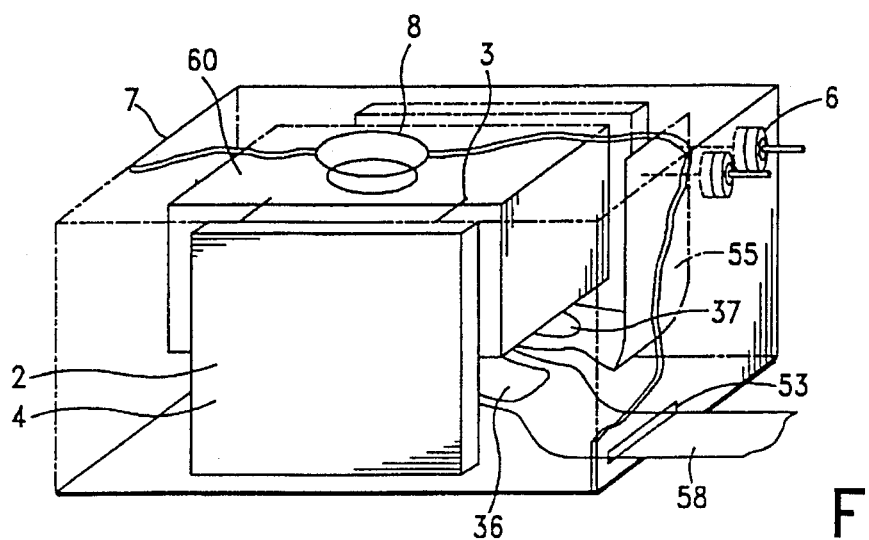
FIG. 20 is a perspective view of another modified example of the optical head of the second embodiment in a partially broken-away state.

In FIG. 20, another modified optical head 1 has pre-amplifier circuit 36 disposed on flat cable 58 and laser noise reduction circuit 37 disposed on flat cable 55. Circuits 36 and 37 contact with the bottom surface of lens holder 60. Therefore, the length of the cables connecting between circuits 36, 37 and lens holder 60 can be minimized. This arrangement can be effective because it is possible to minimize the leaked noises and suppress the noises entering into pre-amplifier circuit 36 in spite of the very high frequency wave generated by laser noise reduction circuit 37.

In FIGS. 21 and 22, another modified optical head 1 has pre-amplifier circuit 36 and laser noise reduction circuit 37. Both circuits are arranged on the back side of a board 69. Laser emission unit 70 is mounted in the front side of board 69. The cable connecting between board 69 and outside device extends from lens holder 60 to the outside of housing 7. Board 69 (shown in FIG. 22) can be either a plastic board or semiconductor wafer. If board 69 is a semiconductor wafer, pre-amplifier circuit 36 and laser noise reduction circuit 37 can be formed on board 69 by semiconductor process. Since circuits 36 and 37 and laser emission unit 70 are mounted on the same board 69, the distance between circuits 36, 37 and laser emission unit 70 can be minimized. Furthermore, the leakage of noise and the addition of noise can be lower. These circuits 36 and 37 may be mounted on the same surface as that on which laser emission unit 70 is mounted. Alternatively, pre-amplifier circuit 36 and laser emission unit 70 may be mounted on the same surface of board 69 and laser noise reduction circuit 37 may be on the other surface.

HOUSING OF AN OPTICAL HEAD OF THE THIRD EMBODIMENT

In FIG. 23, an optical head 1 of another embodiment is shown. The optical head has a cylindrical-shaped lens holder and a housing 7 similar to those of the first embodiment. Furthermore, optical head 1 of this embodiment has a transparent cover 81 on a laser emitting port 8' for covering this port 8'. In addition in housing 7, laser noise reduction circuit 37 is arranged on a board 82. The internal wires connect between lens holder 10 and board 82. The outgoing wires extend to the outside of housing 7 via a plurality of penetrating capacitors 6.

Because this optical head has transparent cover 81 on laser emitting port 8', housing 7 is completely closed and no dust or other contaminative materials can come into housing 7. Since optical head 1 of this embodiment has a superior dust proof, optical head 1 can be used in a dusty environment. Furthermore, cover 81 can have an electrically conductive coating, so that in addition to the shielding effect of housing 7 itself, the leakage of noises from optical head 1 can be reduced to the lowest level.

In FIG. 24, a modified optical head of this embodiment has a plurality of low pass filters 84 disposed on a board 82 and a flat cable 85 extending from the low pass filters inside housing 7 to the outside.

In FIG. 25, the components of low pass filter 84 are shown. Low pass filter 84 is composed of an LC network having two coils 84a connected in series and a capacitor 84b which has a terminal connected between coils 84a. The other terminal of capacitor 84b is a grounding terminal 84c which may be connected to a grounding side of optical head 1. Through this low pass filter 84, among the signals fed to an input terminal 84d, only signals containing frequency components below a cut off frequency as determined by coils 84a and capacitor 84b can pass. When the cut off frequency is higher enough than the range of the signals to be handled in the circuits such as signal detection circuit 34, but is lower enough than the oscillating frequency of the high frequency wave component generated and superposed by laser noise reduction circuit 37, the leakage of the noises from the cable extending from the housing to the outside can be prevented.

In this optical head 1, since low pass filters 84 can be pre-assembled on board 82, the number of processes for assembling the optical head can be decreased. Further, since the assembly of low pass filters 84 required only coils and capacitors, the cost of low pass filters 84 is very low. Thus, the assembling cost of the optical head having low pass filters 84 can be decreased.

In FIG. 26, another modified optical head 1 is shown. In this optical head, a board 86 is disposed on a side wall of housing 7. A pre-amplifier circuit 36 is arranged on board 86. An electrically conductive shielding panel 87 is disposed between board 86 and board 82 on which a laser noise reduction circuit 37 is arranged. Although in this optical head, shielding panel 87 is disposed near board 86 on which pre-amplifier circuit 36 is arranged, shielding panel 87 can be disposed near board 82. Such arrangement may be desirable to protect pre-amplifier circuit 36 from the leaked noises, if the high power high frequency wave component is generated in laser noise reduction circuit 37.

In FIG. 27, another modified optical head 1 has a board 86 on which pre-amplifier circuit 36 is arranged. Circuit 36 is located between a side wall of housing 7 and a supporting plate 4 which supports lens holder 10 by spring 3. Since supporting plate 4 and lens holder 10 are located between pre-amplifier circuit 36 and laser noise reduction circuit 37, the noise effect from circuit 37 on circuit 36 can be reduced as in the case where the optical head uses a shielding panel. Further, because board 86 containing circuit 36 is disposed in a dead space between supporting plate 4 and the side panel of housing 7, the space for mounting circuit 36 can be saved and a smaller optical head can be produced. In addition, the distance between pre-amplifier circuit 36 and lens holder 10 is shorter, and the length of the cable is decreased. Thus, pre-amplifier circuit 36 in this arrangement can stand against the noises relatively well.

LENS HOLDER

In FIG. 28, a lens holder 10 of this embodiment is schematically illustrated. The laser beam emitted from laser emission unit 20 is focused on, for example, optical disk 90 by way of diffraction grating 11, objective lens 12 and cover 81 mounted on emitting port 8. A part of the emitted laser beam from unit 20 is reflected at boundary area 11a of diffraction grating 11 which does not have the shape of diffraction grating. The reflected laser beam returns to laser output power detection circuit in laser emission unit 20. On boundary area 11a of diffraction grating 11, a reflection coating is applied in order to sufficiently reflect the forwardly emitted laser beam to the power detection circuit for accurately measuring the power. On the other hand, the reflected beam from optical disk 90 returns into lens holder 10 via cover 81 and objective lens 12 and is astigmatically converged on laser emission unit 20 after being diffracted by diffraction grating 11. Then the reflected beam is detected by the signal detection circuit disposed in laser emission unit 20. Since laser unit 20 has both the emitting part and the receiving part in itself, the light path for the forward and reflected laser beams can be commonly used and a smaller-sized optical head can be produced.

LASER EMISSION UNIT

In FIG. 29, laser emission unit 20 in the above lens holder 10 has generally the same arrangement as that of the canned type in the first embodiment. Further, in laser emission unit 20, the laser output power detection circuit, the signal detection circuit and the pre-amplifier circuit are integrated in wafer 30 which is disposed on the top of radiator 22. Since laser diode 21 is also disposed on the top of radiator 22, a hole for passing the laser beam is arranged in wafer 30. Also, a plurality of rod type electrodes 27 are so arranged that the top of electrodes 27 is at the same level as the top of radiator 22, in order to easily connect electrodes 27 and wafer 30 by bonding wires 28. Since laser emission unit 20 has a plurality of circuits such as the laser output power detection circuit, the pre-amplifier circuit etc., laser emission unit 20 is a multi-functional laser unit.

Figure 30:
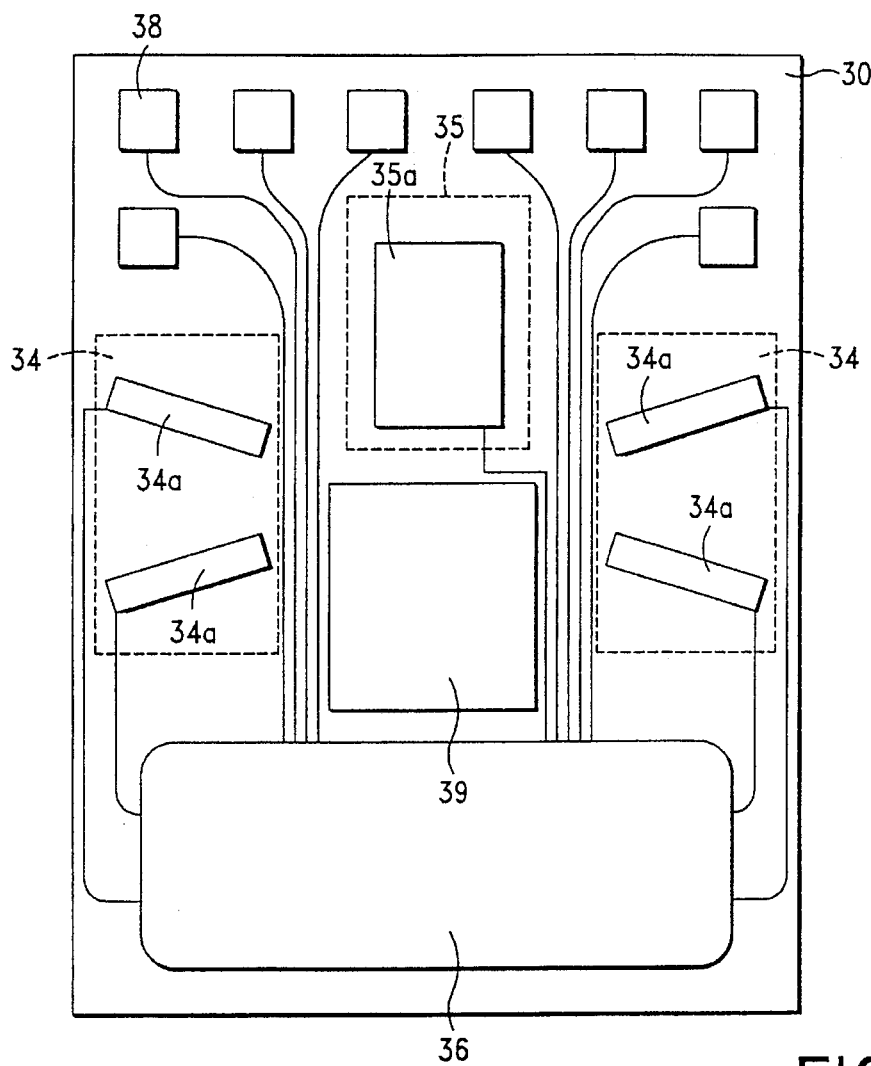
FIG. 30 is a plan view of a wafer in the laser emission unit of FIG. 29.

In FIG. 30, wafer 30 in the above laser unit 20 has a hole 39 of a rectangular shape for passing the laser beam from laser diode 21 because wafer 30 is disposed on the top of radiator as mentioned above. Signal detection circuits 34 are disposed on both sides of hole 39 and each contains two photo diodes. Laser output power detection circuit 35 contains a photo diode 35a and is disposed on one end of wafer 30 in line with hole 39. Pre-amplifier circuit 36 is disposed on the other end of wafer 30 in line with power detection circuit 35 and hole 39. A plurality of electrodes 38 are disposed around wafer 30.

In this wafer 30, signals generated from laser output power detection circuit 35 and signal detection circuit 34 are sent to pre-amplifier circuit 36 and are amplified after the current-voltage conversions. Since the distances between circuits 34, 35 and amplifier circuit 36 are so short that the influence of noises is minimized. Further, on the same wafer 30, in addition to hole 39, circuits 34, 35 and 36 can be manufactured by the semiconductor process. Therefore, the laser diode and the photo diodes are disposed at accurate positions relative to each other. Thus, a high and stable quality laser emission unit can be produced. Also, as in the other embodiments mentioned before, the manufacturing costs and time can be reduced.

In FIG. 31, a modified laser emission unit 20 has wafer 30 containing laser diode 21, laser output power detection circuit 35, signal detection circuit 34, etc. In addition, this laser emission unit 20 has a reflecting panel 29 disposed on an emitting window 26 at cap 25. The reflecting panel extends from the periphery of the window to its center. A part of the laser beam emitted forwardly from laser diode is reflected at reflecting panel 29 and received by laser power detection circuit 35 on wafer 30. Concerning the emitting angle of the laser beam from laser diode 21, a part of this angle along the longer edge of laser diode 21 is narrow, and another part of this angle along the shorter edge of laser diode 21 is wide. Therefore, in laser emission unit 20, reflecting panel 29 extends in a direction perpendicular to the longer edge of laser diode 21, namely in the direction of the shorter edge of diode 21 in order to reflect a high intensity part of the forwardly emitted laser beam into power detection circuit 35. Thus, laser output power detection circuit 35 can effectively detect the forwardly emitted laser beam and can increase the sensitivity of such detection.

In FIG. 32, another modified laser emission unit 20 is also of the canned type, but it has laser diode 21 disposed horizontally on the top of radiator 22 which is located off the center of disk-like stem 24. A wafer 30 is disposed on the center of stem 24. Wafer 30 contains a main prism 75, a sub-prism 76, power detection circuit 35, and signal detection circuit 34. Circuits 34 and 35 are arranged on the sides of prism 75 and 76. Moreover, pre-amplifier circuit 36 is arranged on one end of wafer 30, and laser noise reduction circuit 37 and radiator 22 are arranged on the other end of wafer 30. Circuits 34, 35, 36 and 37 are fabricated on wafer 30 by semiconductor manufacturing process. Main prism 75, sub-prism 76 and radiator 22 are fixed on wafer 30 by adhesive or other fixing material.

The direction of a major part of the laser beam emitted from the laser diode disposed horizontally is changed by main prism 75 perpendicularly up toward emitting window 26 through which the laser beam is output. The residual part of the laser beam goes through main prism 75 and the direction of the residual beam is changed by sub-prism 76 toward the photo diode of laser power detection circuit 35. Hence, laser output power detection circuit 35 in this laser emission unit 20 can detect a part of the forwardly emitted laser beam and can confirm the output power accurately. In this laser emission unit 20, since the light path of the laser beam is changed by main prism 75 disposed on the center of unit 20, it is not necessary to mount laser diode 21 on the center of unit 20, and thus the arrangement in unit 20 can be flexibly designed. Therefore, the positions and the sizes of the circuits become relatively flexible. Further, because radiator 22 and the prisms are mounted on wafer 30, the size of wafer 30 becomes larger and can be easily assembled on stem 24.

Figure 33:
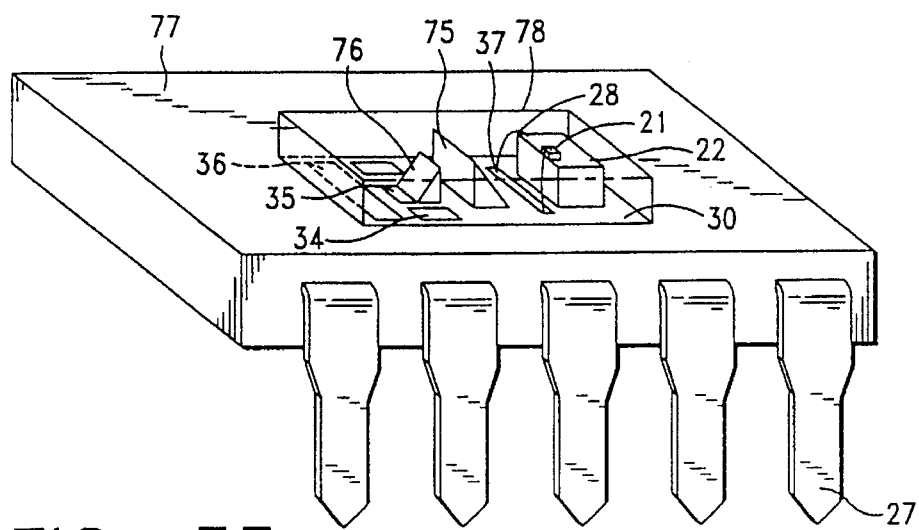
FIG. 33 is a perspective view of another modified example of the laser emission unit of the third embodiment in a partially broken-away state.

In FIG. 33, a molded type laser emission unit has wafer 30 having the identical arrangement as in the above wafer, ceramic package 77, and transparent resin 78 molding wafer 30 on ceramic package 77. Since the unit molding wafer 30 on package 77 is so thin and has light weight, the optical head using this laser unit becomes smaller and has lighter weight. Also, because ceramic package 77 due to molding has a good size and can sit on a printed electrical board, the connections between this laser emission unit and other circuits can be made easily. Also, this laser emission unit can be directly assembled on the circuit board. In addition, since molding resin 78 is transparent but can reflect a part of the laser beam, laser output power detection circuit 35 can detect the reflected beam from resin 78.

Figure 34:
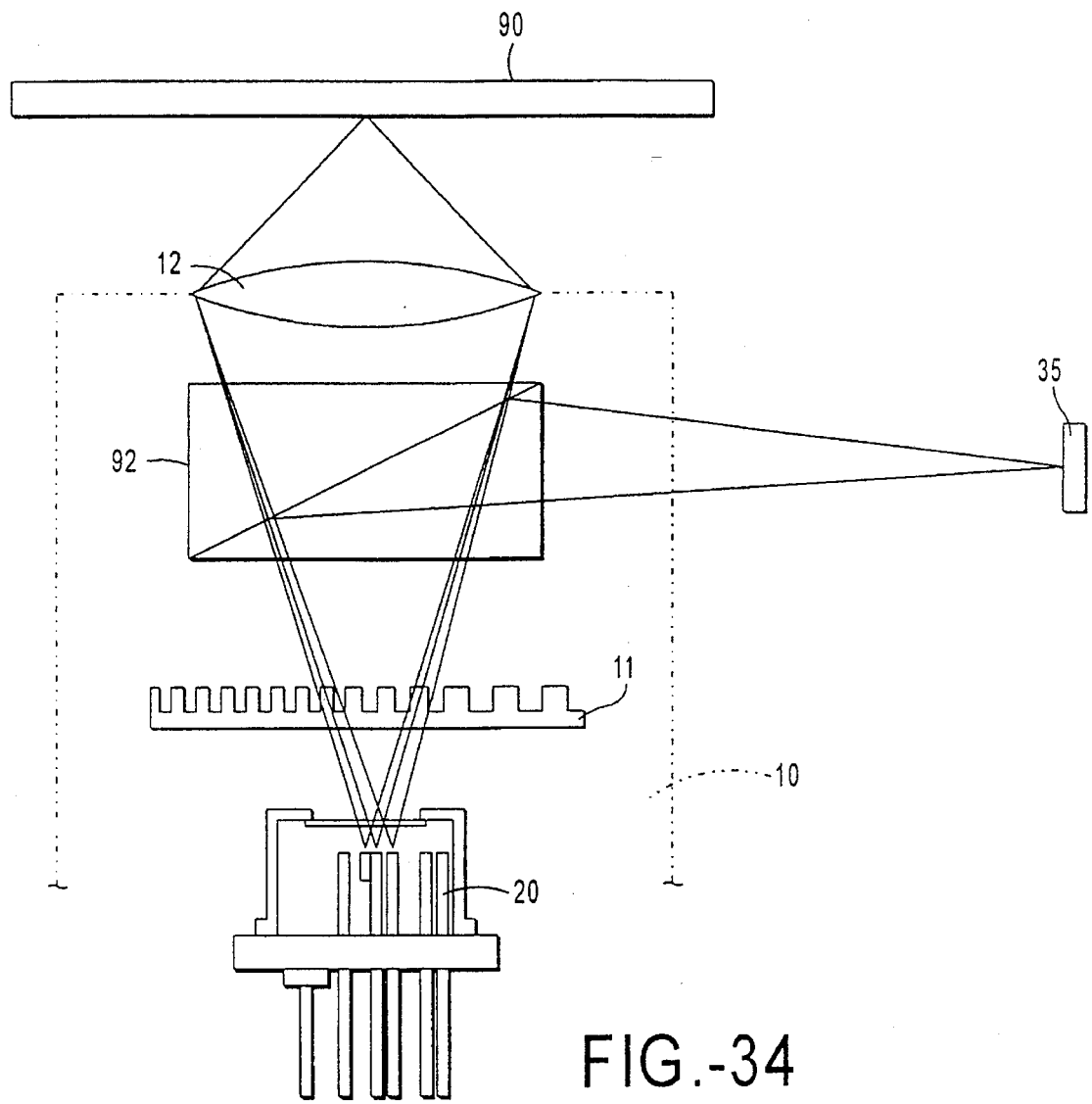
FIG. 34 shows another modified example of the laser emission unit of the third embodiment with the light path.

In FIGS. 34, 35 and 36, another laser emission unit 20 is shown. In this laser emission unit 20, laser output power detection circuit 35 is disposed outside unit 20. The direction of a part of the laser beam emitted from laser emission unit 20 is changed toward circuit 35 by prism 92 which is disposed in, for example, the lens holder. In FIG. 35, this laser emission unit 20 has a wafer 30 which has an arrangement shown in FIG. 36. Wafer 30 contains signal detection circuit 34, pre-amplifier circuit 36 and laser noise reduction circuit 37. In this laser emission unit 20, the emitted laser beam is reflected by an optical disk etc. The reflected beam returns to unit 20 along the same light path and is detected by signal detection circuit 34 on wafer 30. If this laser emission unit 20 is used in the optical head, a separate signal detection circuit and a separate light path for the signal detection can be eliminated. Therefore, a smaller optical head can be produced. Since the laser output power detection circuit is arranged outside laser emission unit 20, the type and dimension of the photo diodes in the power detection circuit can be flexibly selected.

Figure 37:
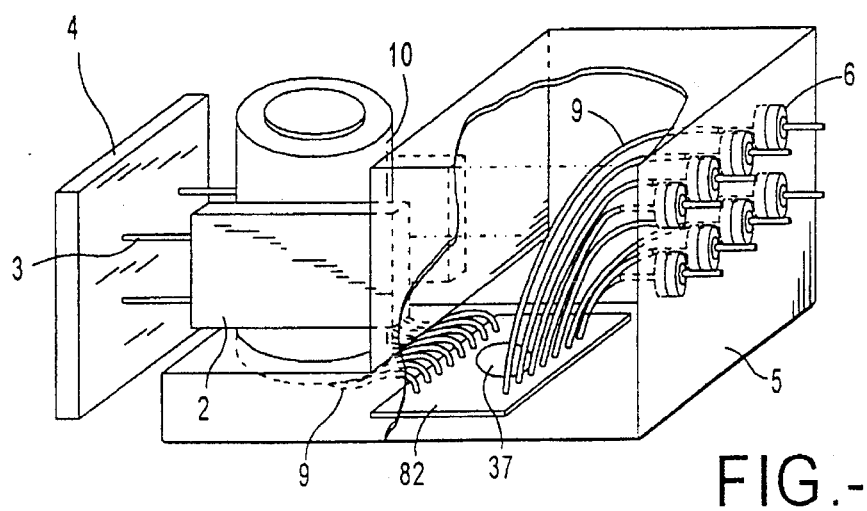
FIG. 37 is a perspective view of another modified example of the optical head of the third embodiment in a partially broken-away state.
Figure 46:
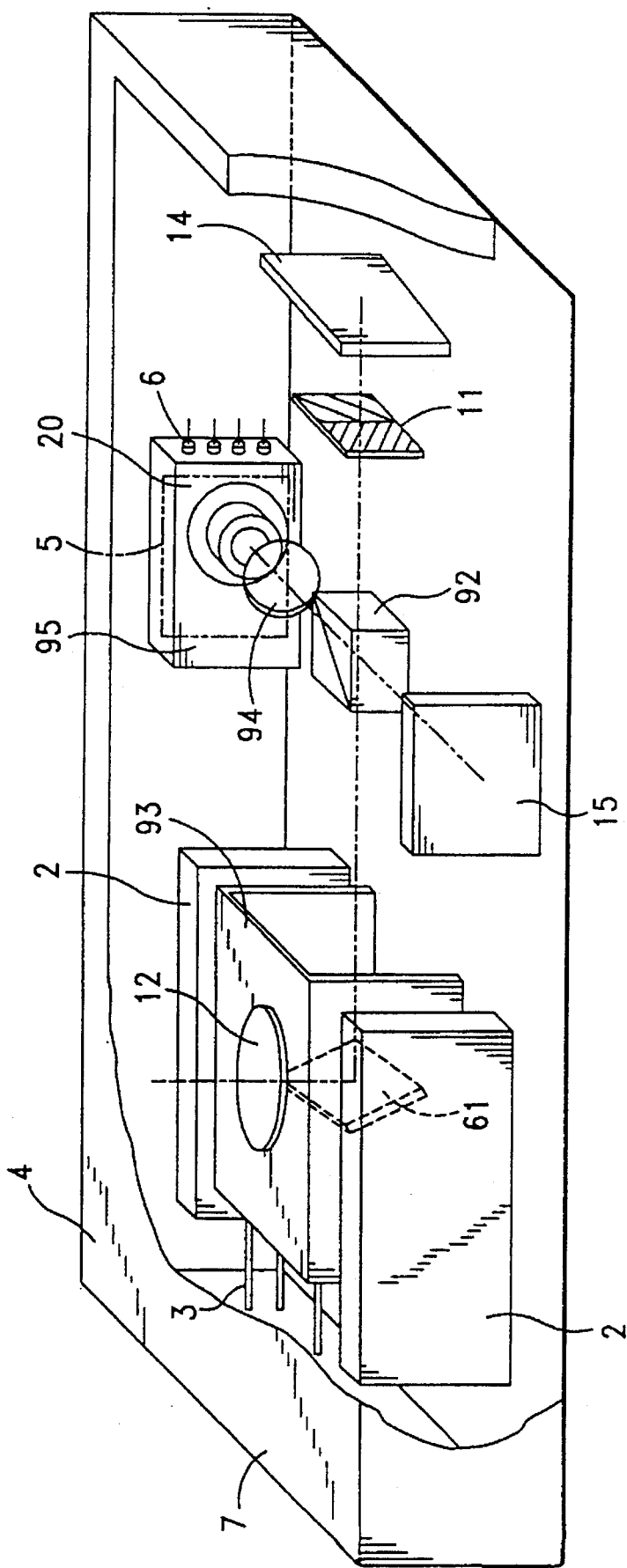
FIG. 46 is a perspective view of a prior art optical head in a partially broken-away state.

In FIG. 37, another modified optical head 1 of this embodiment includes a shielding unit 5 having a multi-surface body surrounding the bottom part of a cylindrical lens holder 10. Optical head also includes a board 82 on which laser noise reduction circuit 37 is disposed. Shielding unit 5 is preferably made of electrically conductive material in order to prevent the leakage of the noises from laser noise reduction circuit 37. In addition, the volume resistivity of unit 5 should be less than $4 \times 10^{-3}$ $\Omega \cdot cm$. Unit 5 is preferably connected to the ground side of the optical head or that of laser emission unit 20 in order to obtain good shielding effect. Furthermore, in order to prevent the resistive action to the magnetic field generated by the focusing coil, tracking coils and magnet plates, unit 5 should have a non-magnetic body made of, for example, metallic material such as aluminum and copper, electrically conductive plastic, or formed plastic having metallic coating or electrically conductive coating. The body of unit 5 made of magnesium has lighter weight and superior shielding effect, and it is possible to reduce the load for the position control of lens holder 10.

Although, in this optical head, the penetration capacitors are used to prevent the leakage from the wires outgoing from unit 5, low pass filters can be used instead of the capacitors.

In this optical head, since the noises generated at laser noise reduction circuit 37 can be shielded by unit 5, it is not necessary to use the housing for shielding. Thus, it is possible to eliminate the housing if it is not required for other reasons such as dust proof. Therefore, a smaller optical head and a smaller optical memory device can be produced because it is not necessary to keep a moving space for the optical head housing. In addition, if the housing is eliminated, lens holder 10 may directly contact with air. Thus, heat radiation is more effective, and a high-power laser beam can be emitted.

In FIG. 38, another modified optical head 1 has a smaller shielding unit 5 containing laser noise reduction circuit 37 therein and mounted below cylindrical lens holder 10. Since the position of lens holder 10 is controlled by the focusing coil or tracking coils, it is preferable that the weight and load to be controlled by the coils be decreased by using the smaller shielding unit 5. Further, it may be possible to decrease the size of shielding unit 5 if laser noise reduction circuit 37 is arranged on a flexible or flat cable, or on a semiconductor wafer.

In FIG. 39, another modified optical head 1 has a lens holder 60 having a rectangular shape and a shielding unit 5 containing laser noise reduction circuit 37. Shielding unit 5 has a rectangular shape and has the same size as that of lens holder 60. This shielding unit 5 is attached on the bottom of lens holder 60 by adhesive material, or screw, for example. In this optical head 1, since the rectangular lens holder 60 is thinner, a thin type of optical head is produced.

FIG. 40 shows lens holder 60 and shielding unit 5 before assembling. This holder 60 has an objective lens 12 on its upper surface, a slit 67 on its bottom surface opposite to the upper surface for passing electrodes and a flexible cable, and a slit 66 on a side surface for passing a flexible cable. Unit 5 has a slit 68 having the same size as that of slit 67 on its upper surface to be attached to holder 60. Slit 68 is in alignment with slit 67.

In FIG. 41, the arrangement of the components in optical head 1 described above is shown. Lens holder 60 of this optical head 1 has an arrangement almost the same as that of the lens holder having a rectangular shape described above. Lens holder 60 includes a laser emission unit 70 containing a wafer on which a laser diode, a laser output power detection circuit, a signal detection circuit and a pre-amplifier circuit are mounted. The lens holder also includes a diffraction grating 11, a mirror 61, and an objective lens 12. Thus, in lens holder 60, the laser beam emitted from laser emission unit 70 is focused on an optical disk by mirror 61 and objective lens 12. The reflected beam from the optical disk returns to laser emission unit 70 through objective lens 12, mirror 61 and diffraction grating 11. A part of the forwardly emitted beam is reflected by diffraction grating 11 and returns into laser emission unit 70 (as mentioned previously). However, a part of this emitted beam can be detected by other method without using diffraction grating 11. Signals from the laser output power detection circuit and signal detection circuits are sent to the pre-amplifier circuit by which the signals are amplified. The amplified signals are then delivered to outside from the lens holder via flexible cable 58 which extends to the outside through slit 66 located on one side of lens holder 60.

On the other hand, the current for driving the laser diode in laser emission unit 70 is input to laser noise reduction circuit 37 via penetrating capacitors 6 fixed on one side wall of shielding unit 5. Circuit 37 is disposed on board 82 mounted in shielding unit 5. The driving current is supplied to laser emission unit 70 for driving the laser diode via connecting electrodes 27 after a high frequency wave component is superposed on at laser noise reduction circuit 37. Board 82 is connected to laser emission unit 70 via connecting electrodes 27 disposed through slit 67 of lens holder 60 and slit 68 of shielding unit 5.

In FIG. 42, lens holder 60 has focusing coils and tracking coils on its side walls in order to perform focusing and tracking operations upon supplying current to these coils as explained previously. Since fine focusing and tracking can be achieved if the weight to be controlled by these coils is light, this shielding unit 5 having thin and small dimension is preferable, and the electrical consumption for these operations can be reduced. Also, in order not to interfere with the fine position control by the magnetic fields generated by coils 13, 14 and magnet plates 2 both disposed outside of lens holder 60, shielding unit 5 should be made of a non-magnetic body.

FIG. 43 shows another modified lens holder 60 having a rectangular shape. Lens holder 60 comprises a board 82 containing a laser noise reduction circuit 37, a laser emission unit 70, a diffraction grating 11, a mirror 61 and an objective mirror 12. In order to shield the noises from the laser noise reduction circuit and to arrange the focusing coils and tracking coils on the side walls, a holder cover 65 is used. The holder cover is made of an electrically conductive and non-magnetic material for example, metallic material such as aluminum or copper, electrically conductive plastic, formed plastic with conductive coating or conductive painting etc., or magnesium or alloy including magnesium. If made of magnesium or alloy including magnesium, the holder cover has a lighter weight and high shielding characteristics. Also, a plurality of the penetrating capacitors are mounted on one side wall of holder cover 65 in order to prevent the leakage of the noises.

An optical head having a smaller size can be produced using lens holder 60 integrating both the laser emitting and receiving parts. Further, since the shielding of noise is performed by lens holder 60 itself, the housing for the optical head can be eliminated. Therefore, an optical memory device having smaller dimension can be produced using this optical head.

In FIG. 44, another modified lens holder 60 has a plurality of low pass filters 84 arranged on a board 82. Since a cable 58 connected to low pass filters 84 carries signals and current between lens holder 60 and outside device, the noise leakage from lens holder 60 is prevented.

In addition, low pass filters 84 have a simple structure and a light weight. Moreover, they are of low cost and are easy to be assembled if they are pre-assembled on board 82. Therefore, the optical head having a lighter weight and of lower cost can be produced.

In FIG. 45, another modified lens holder 60 has a laser emission unit 70 containing a laser noise reduction circuit in addition to a laser output power detection circuit, a signal detection circuit and a pre-amplifier circuit. A plurality of low pass filters are disposed on a flexible cable 58 which extends from electrodes 27 of laser emission unit 70 to the outside through slit 66 on holder 60.

In this lens holder 60, in addition to the circuits for the laser emitting and receiving parts, the laser noise reduction circuit is integrated in laser emission unit 70. Lens holder 60 itself can serve as a shielding unit against noise. Therefore, this lens holder 60 containing laser emission unit 70, diffraction grating 11, mirror 61 and objective lens 12 can perform multiple functions such as laser emission, laser reception, signal amplification, laser noise reduction, and noise shielding. The lens holder also has a very small dimension and light weight. And, it is desirable to use this lens holder 60 to produce an optical head having a minimized size with an especially thin and lighter weight.

While the invention has been described in conjunction with several specific embodiments, it is evident to those skilled in the art that many further alternatives, modifications and variations will be apparent in light of the foregoing description. Thus, the invention described herein is intended to embrace all such alternatives, modifications, applications and variations as may fall within the spirit and scope of the appended claims.

What is claimed is:

1. An optical head, comprising:

a shielding unit made of conductive, non-magnetic material;

a lens holder mounted on said shielding unit and including:

a laser emission unit including:

a supporting portion, a laser diode, mounted on said supporting portion, for forwardly emitting a laser beam onto an optical medium from which the laser beam is reflected and returns as a returning beam, converging means for focusing the forwardly emitted laser beam onto the optical medium and for passing through the returning beam reflected from the optical medium;

a board disposed in said shielding unit and coupled to said lens holder;

laser noise reduction means, mounted on said board, for superposing a high frequency wave component onto an externally supplied driving current for driving said laser diode and for reducing the coherence of the forwardly emitted laser beam; and means, arranged on at least one of said shielding unit and said lens holder, for finely controlling a position of said lens holder magnetically so as to finely control focusing and tracking of said forwardly emitted laser beam on said optical medium.

2. The optical head of claim 1, further comprising at least one capacitor penetrating a wall of said shielding unit and coupled between said laser noise reduction means and external circuits.

3. The optical head of claim 1, further comprising at least one low pass filter disposed in said shielding unit and coupled between said laser noise reduction means and external circuits.

4. The optical head of claim 1, wherein said shielding unit is coupled to a ground terminal of said laser diode.

5. The optical head of claim 1, wherein said board is a semiconductor wafer.

6. The optical head of claim 1, wherein said shielding unit is of an L shape and includes a vertical branch portion and a horizontal branch portion and said lens holder is mounted on the horizontal branch portion.

7. The optical head of claim 6, further comprising at least one capacitor penetrating a wall of the vertical branch portion of said shielding unit and coupled between said laser noise reduction means and external circuits.

8. The optical head of claim 1 wherein:

said laser emission unit further includes a semiconductor wafer mounted on said supporting portion and including laser output power detection means, signal detection means, and pre-amplifier means formed thereon, said laser output power detection means detecting a part of the forwardly emitted laser beam for confirming the output power of the forwardly emitted laser beam, said signal detection means detecting the returning beam for determining signals, and said pre-amplifier means amplifying signals generated from at least one of said laser output power detection means and said signal detection means, and said lens holder further includes:
- diffraction grating means for passing through the laser beam and diffracting the returning beam for astigmatically converging the returning beam onto said signal detection means; and
- means for reflecting the laser beam passing through said diffraction grating means so as to change the light path of the laser beam to a second direction perpendicular to the first direction, and for reflecting the returning beam in the reverse second direction toward said diffraction grating means;

wherein said converging means directs the returning beam toward said reflecting means.

9. The optical head of claim 1 wherein said holder and said shielding unit each include an opening and said laser noise reduction means is coupled to said laser emission unit through the openings.

10. The optical head of claim 1 wherein said lens holder and said shielding unit each has a substantially same rectangular shape.

11. The optical head of claim 1 wherein said laser emission unit further includes a semiconductor wafer mounted on said supporting portion and including laser output power detection means, signal detection means and pre-amplifier means formed thereon, said laser output power detection means detecting a part of the forwardly emitted laser beam for confirming an output power of the forwardly emitted laser beam, said signal detection means detecting the returning beam for determining signals, and said pre-amplifier means amplifying signals generated from at least one of said laser output power detection means and said signal detection means; and wherein said lens holder further includes diffraction grating means for passing through the laser beam and diffracting the returning beam for astigmatically converging the returning beam onto said signal detection means, wherein said converging means directs the returning beam toward said diffraction grating means.

* * * * *